(12) United States Patent
Kim

(10) Patent No.: US 9,330,765 B2
(45) Date of Patent: May 3, 2016

(54) NON-VOLATILE MEMORY DEVICE HAVING CONFIGURABLE PAGE SIZE

(71) Applicant: CONVERSANT INTELLECTUAL PROPERTY MANAGEMENT INC., Ottawa (CA)

(72) Inventor: Jin-Ki Kim, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 14/809,831

(22) Filed: Jul. 27, 2015

(65) Prior Publication Data

US 2016/0005469 A1    Jan. 7, 2016

Related U.S. Application Data

(63) Continuation of application No. 14/158,116, filed on Jan. 17, 2014, now Pat. No. 9,117,527, which is a (Continued)

(51) Int. Cl.
*G11C 16/08* (2006.01)
*G11C 16/16* (2006.01)
(Continued)

(52) U.S. Cl.
CPC .............. *G11C 16/08* (2013.01); *G11C 15/046* (2013.01); *G11C 16/0483* (2013.01); *G11C 16/16* (2013.01); *G11C 16/26* (2013.01)

(58) Field of Classification Search
CPC ............ G11C 8/08; G11C 8/10; G11C 16/08; G11C 16/10; G11C 16/22; G11C 16/0483; G11C 15/046

USPC ................... 365/185.12, 185.23, 63, 185.11, 365/185.17, 185.33, 230.03, 230.06
See application file for complete search history.

(56) References Cited

U.S. PATENT DOCUMENTS

| 8,780,635 B2* | 7/2014 | Li | G11C 16/08 365/185.17 |
| 8,792,279 B2* | 7/2014 | Li | G06F 12/0246 365/185.17 |
| 2015/0179269 A1* | 6/2015 | Lee | G11C 16/14 365/185.03 |

FOREIGN PATENT DOCUMENTS

| KR | 10-0204810 | 6/1999 |
| KR | 10-0685638 | 2/2007 |
| KR | 10-0739256 | 7/2007 |

OTHER PUBLICATIONS

"128M x 8 Bits NAND Flash Memory", K9T1G08B0M Preliminary Flash Memory, Samsung Electronics, pp. 1-38, Nov. 22, 2004.

*Primary Examiner* — Gene Auduong
(74) *Attorney, Agent, or Firm* — Shin Hung; Borden Ladner Gervais LLP

(57) ABSTRACT

A flash memory device having at least one bank, where the each bank has an independently configurable page size. Each bank includes at least two memory planes having corresponding page buffers, where any number and combination of the memory planes are selectively accessed at the same time in response to configuration data and address data. The configuration data can be loaded into the memory device upon power up for a static page configuration of the bank, or the configuration data can be received with each command to allow for dynamic page configuration of the bank. By selectively adjusting a page size the memory bank, the block size is correspondingly adjusted.

21 Claims, 21 Drawing Sheets

Related U.S. Application Data continuation of application No. 13/743,899, filed on Jan. 17, 2013, now Pat. No. 8,675,408, which is a continuation of application No. 13/276,856, filed on Oct. 19, 2011, now Pat. No. 8,379,450, which is a continuation of application No. 12/329,929, filed on Dec. 8, 2008, now Pat. No. 8,068,365.

(60) Provisional application No. 61/025,920, filed on Feb. 4, 2008, provisional application No. 61/081,910, filed on Jul. 18, 2008.

(51) Int. Cl.
*G11C 16/26* (2006.01)
*G11C 15/04* (2006.01)
*G11C 16/04* (2006.01)

NON-VOLATILE MEMORY DEVICE HAVING CONFIGURABLE PAGE SIZE

CROSS REFERENCE TO RELATED APPLICATIONS

This application is a continuation of U.S. application Ser. No. 14/158,116 filed Jan. 17, 2014, which is a continuation of U.S. application Ser. No. 13/743,899 filed on Jan. 17, 2013, now issued as U.S. Pat. No. 8,675,408 on Mar. 18, 2014, which is a continuation of U.S. application Ser. No. 13/276,856 filed on Oct. 19, 2011, now issued as U.S. Pat. No. 8,379,450, on Feb. 19, 2013, which is a continuation of U.S. application Ser. No. 12/329,929 filed on Dec. 8, 2008, now issued as U.S. Pat. No. 8,068,365, which claims the benefit of priority of U.S. Provisional Patent Application No. 61/025,920 filed Feb. 4, 2008, and of U.S. Provisional Patent Application No. 61/081,910 filed Jul. 18, 2008, which are hereby incorporated by reference.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

FIG. 1 is a block diagram of an asynchronous flash memory device of the prior art. Flash memory device 10 includes interface and control circuits also known as peripheral circuits, and core circuits. The interface and control circuits includes I/O buffers 12, 14 and 16, registers 18, 20, 22, and control circuit 24. The core circuits include a high voltage generator 26, a row predecoder 28, a row decoder 30, a column predecoder 32, a column decoder 34, a page buffer 36, and a memory array 38. Those of skill in the art should understand the function of the circuits of the interface and control circuits, and many details are not shown in order to simplify the schematic. For example, the lines interconnecting the circuit blocks merely illustrates a functional relationship between connected blocks, without detailing the specific signals being used. The output buffer 12 drives the R/B# output pin or port, the control buffers 14 include input buffers each connected to a respective input control pin or port, and the data buffers 16 include bi-directional buffers for receiving and driving data onto a respective I/O pin or port. In the presently described example, the control buffers 14 includes input buffers for the CE#, CLE, ALE, WE#, RE# and WP# input control pins or ports. There are eight data I/O pins or port in the presently described example, therefore there are eight bi-directional buffers. Asynchronous input buffers and output buffer circuits are well known in the art, and do not need to be described in any further detail.

To execute operations such as erase, program and read in asynchronous flash memory device 10, a command is provided via the data I/O pins. This command can include an operational code (OP code) that corresponds to a specific operation, address information and data, depending on the operation being executed. It is noted that because address and write (program) data can be more than 8 bits in length, several input iterations or cycles may be required before all the address and write data bits are latched in the proper registers. The OP code data is latched in the command register 18, and address information for read and program operations is latched in address register 20. The OP code data is provided to the control circuit 24, which includes logic for decoding the OP code, such as a command decoder or interpreter for example. The control circuit 24 includes control logic that generates the internal control signals with the required timing for operating both the core circuits and any peripheral circuits of the flash memory device 10.

The core circuitry consisting of a high voltage generator 26, row predecoder 28, row decoder 30, column predecoder 32, column decoder 34, page buffer 36, and memory array 38 are well known to persons familiar with flash memory. The high voltage generator 26 is used for read, program and erase operations. In terms of a read operation, a circuit description relating to this is provided below.

With respect to a read operation, the row predecoder 28 receives a row address from address register 20 while the column predecoder 32 receives a column address from address register 20. The predecoded row signals are used by the row decoder 30 to drive a wordline of memory array 38 for accessing a page of data. The data stored in the memory cells connected to the selected wordline are sensed and stored in the page buffer 36 via bitlines. In the example memory array 38, continuous wordlines extend horizontally from the left side at the row decoder 30 to the right side of the memory array 38. The predecoded column signals are used by column decoder 34 for selecting a set of 8 bits of data from the page buffer 36 to output to the data buffers 16. 8 bits are used by example, but other configurations can be used. It should be noted that the sequence and timing of asserted control signals originates from the control circuit 24 in response to the received OP code.

FIG. 2 is a schematic showing the basic organization of any NAND flash memory array. Memory array 40 is organized as blocks Block[1] to Block[k], and each block consists of pages $WL_1$ to $WL_i$ where. Both k and i are non-zero integer values. Each page corresponds to a row of memory cells coupled to a common wordline. A detailed description of the memory cells of the block follows. Each block consists of NAND memory cell strings, having flash memory cells 42 serially coupled to each other. Accordingly, wordlines $WL_1$ to $WL_i$ are coupled to the gates of each flash memory cell in the memory cell string. A string select device 44 coupled to string select line signal SSL selectively connects the memory cell string to a bitline 46, while a ground select device 48 coupled to ground select line signal GSL selectively connects the memory cell string to a source line, such as VSS. The string select device 44 and the ground select device 48 are n-channel transistors in the presently described example. Bitlines $BL_1$ to $BL_j$ 46, where j is a non-zero integer value are common to all blocks of memory array 40, and each bitline 46 is coupled to one NAND memory cell string in each of blocks [1] to [k]. Each wordline $WL_1$ to $WL_i$, SSL and GSL signal is coupled to the same corresponding transistor device in each NAND memory cell string in the block. As those skilled in the art should be aware, data stored in the flash memory cells along one wordline is referred to as a page of data.

Coupled to each bitline outside of the memory array 40 is a page buffer 50 for storing one page of write data to be programmed into one page of flash memory cells. The page buffer 50 also includes registers, sense circuits for sensing data read from one page of flash memory cells, and verify logic. During programming operations, the page buffer 50 performs program verify operations to ensure that the data has been properly programmed into the flash memory cells coupled to the selected wordline. To achieve high density, each flash memory cell can either be single level cells (SLC) for storing two logic states, or multi-level cells (MLC) for storing at least two bits of data.

Returning to FIG. 1, the memory array 38 with its corresponding row decoder 30, page buffer 36 and column decoder 34 are commonly referred to as a plane. The size of this plane will reach a practical limit, which is defined by the length of the wordlines and the bitlines. This can be due to a reduction in performance, yield or a combination thereof when the wordlines and bitlines become too long, which is an effect that is well known to persons of skill in the art. One known technique for addressing this problem is to place the row decoder in the middle of the memory array, thereby resulting in segmented physical wordlines that are logically the same. This allows the plane to be increased in size because the row decoder can be shared. One of the driving factors for increasing the size of the plane is the desired increase in the page size. Large page sizes are well suited for multi-media applications such as music, photo and video because the file size to be programmed is typically larger than the maximum page size. Furthermore, the total program time may be nearly the same regardless of the page size, thereby resulting in higher program throughput that further benefits multi-media applications.

While the length of the wordline segments in a plane can be increased, eventually the same performance and yield problems will arise as the wordline lengths are increased. Therefore to accommodate large capacity memory devices, a second plane is introduced as part of the memory array. FIG. 3 is an illustration of a memory array, such as memory array 38 of FIG. 1, organized as two planes.

In FIG. 3 plane 60 includes two sub-arrays 64 and 66 positioned on both sides of a row decoder 60, and a page buffer 68 located at one end of sub-arrays 64 and 66. Plane 62 includes two sub-arrays 70 and 72 positioned on both sides of a row decoder 74, and a page buffer 76 located at one end of sub-arrays 70 and 72. Collectively, page buffers 68 and 76 store one page of data. Each sub-array has the basic NAND flash memory organization shown earlier in FIG. 2. In this example, both sub-arrays of each plane shares one common row decoder, such that the same logical wordline extends horizontally from the row decoders into each sub-array. It is assumed that the page buffers include the column decoding circuits shown in FIG. 1.

In the two plane memory array configuration of FIG. 3, one page of data is read or programmed by simultaneously selecting, or activating, one row in both planes 60 and 62. For example, plane 60 is programmed by loading page buffer 68 with a half page of data and page buffer 76 with the other half page of data, then executing programming operations to write the data to page portions 78 and 80. When reading for example, one row in both planes 60 and 62 (ie. pages 78 and 80) is activated and the data is sensed and stored in page buffers 68 and 76 for subsequent burst read-out.

While multi-media applications reap the benefits of increasing page sizes, other applications using such NAND flash memory will suffer from degraded performance and reliability. Such applications include flash cache and solid state drives (SSD) for hard disk drive (HDD) replacement. In these applications, the file sizes are much smaller than multi-media files, and are frequently updated. For example, a small file may only occupy ¼ of the capacity of the page size, which is quantitatively a small portion of the page and even smaller relative to the memory block associated with the page. However each time the data is modified, which occurs frequently for SSD and cache applications, the entire memory block must be first erased. In FIG. 3 for example, page portions 78 and 80 are both erased prior to a programming operation. As previously mentioned, each memory block includes many pages that store other previously programmed data. Thus well known operations such as page copy operations must be executed to retain the other data that is not being modified. This contributes significantly to reduced endurance of the memory device because the other memory cells in the same page not being modified are subjected to unnecessary erase and program cycles. In the presently described example, the memory cells corresponding to the remaining ¾ of the page are subjected to program and erase cycles. This problem can be addressed with complex wear leveling schemes, but at the cost of degraded system performance. Hence, power consumption is high relative to the small amount of data per page that is to be programmed or modified.

SUMMARY

It is an object of the present invention to obviate or mitigate at least one disadvantage of previous NAND flash memory architectures.

In a first aspect, there is provided a flash memory device. The flash memory device includes a memory bank and a page size configurator. The memory bank has a plurality of planes, where each of the plurality of planes has a page buffer for storing write data for programming to a corresponding plane. The page buffer stores read data from the corresponding plane. The page size configurator selectively enables combinations of the plurality of planes at the same time in response to configuration data and address data during a memory operation.

In a second aspect, there is provided a method for accessing a memory bank. The memory bank can have M planes, where M is an integer greater than 1. The method includes receiving configuration data, logically configuring decoding circuits, generating plane enabling signals, and enabling row decoder circuits. In the step of receiving, the configuration data corresponds to a page size, where the page size corresponds to between 1 and the M planes being simultaneously accessed during a memory operation. In the step of logically configuring, the decoding circuits are configured with the configuration data. In the step of generating, the decoding circuits generate the plane enabling signals in response to address data. In the step of enabling, the row decoder circuits are enabled in response to the plane enabling signals for simultaneously driving wordlines of the 1 to M planes.

Other aspects and features of the present invention will become apparent to those ordinarily skilled in the art upon review of the following detailed description taken in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Various embodiments of the present invention describe a flash memory device having at least one bank, where the each bank has an independently configurable page size. Each bank includes at least two memory planes having corresponding page buffers, where any number and combination of the memory planes are selectively accessed at the same time in response to configuration data. The configuration data can be loaded into the memory device upon power up for a static page configuration of the bank, or the configuration data can be received with a command to allow for dynamic page configuration of the bank. The command can be an operational command for instructing the flash memory device to execute an operation, or the command can be a dedicated instruction for configuring the page size of a selected bank.

Figure 1:
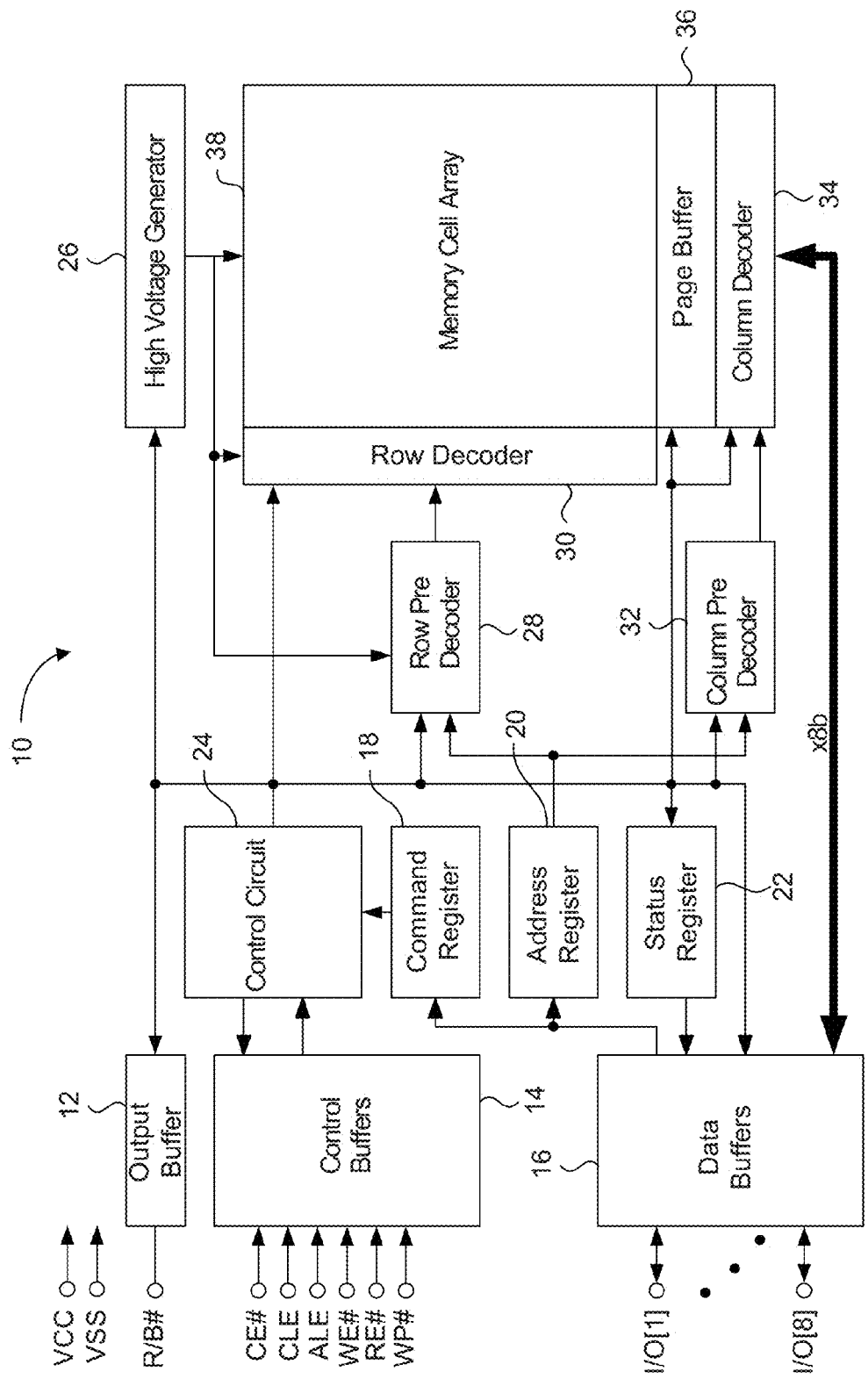
FIG. 1 is a block diagram of a NAND Flash memory device.
Figure 2:
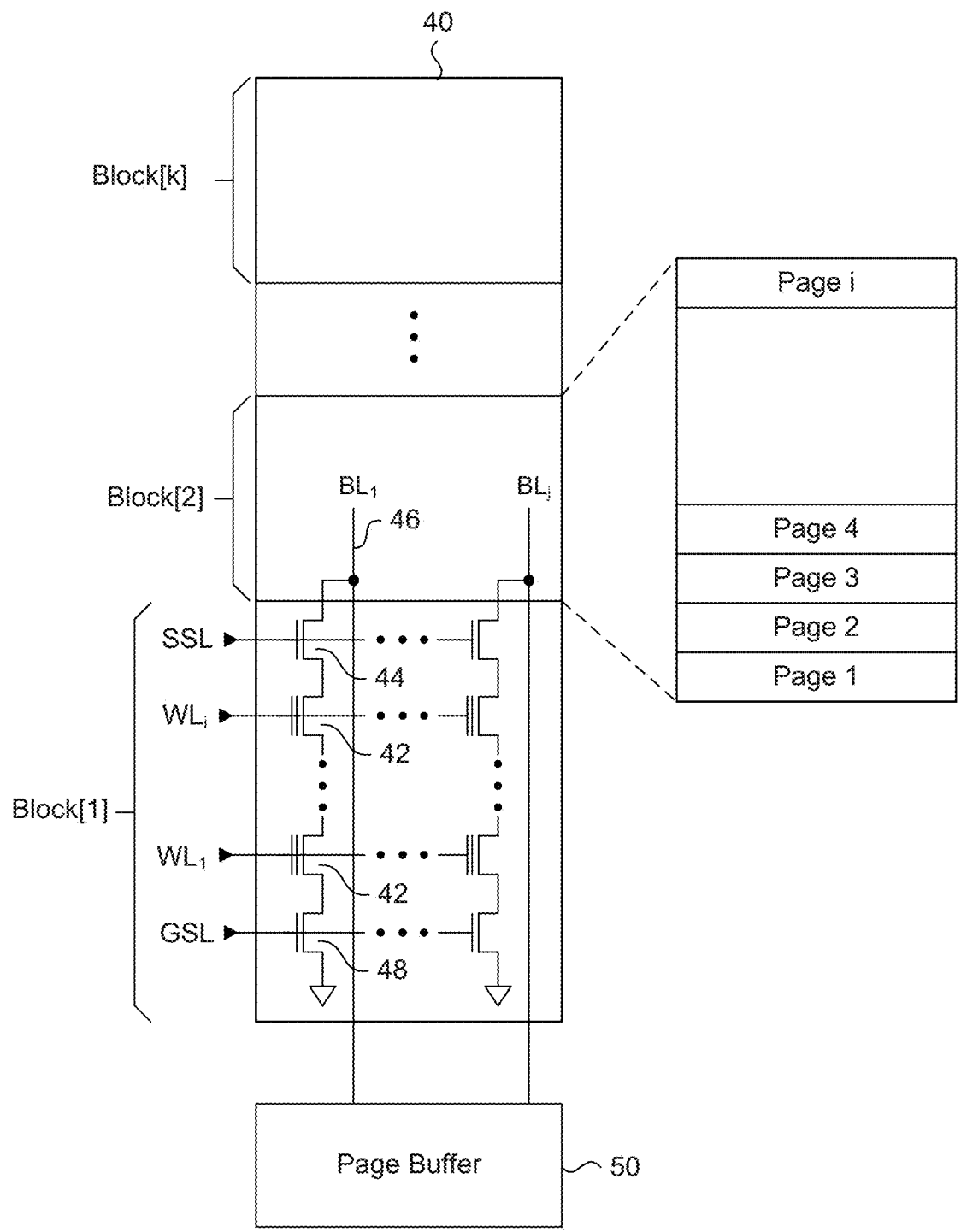
FIG. 2 is a circuit schematic showing a NAND flash memory organization.
Figure 3:
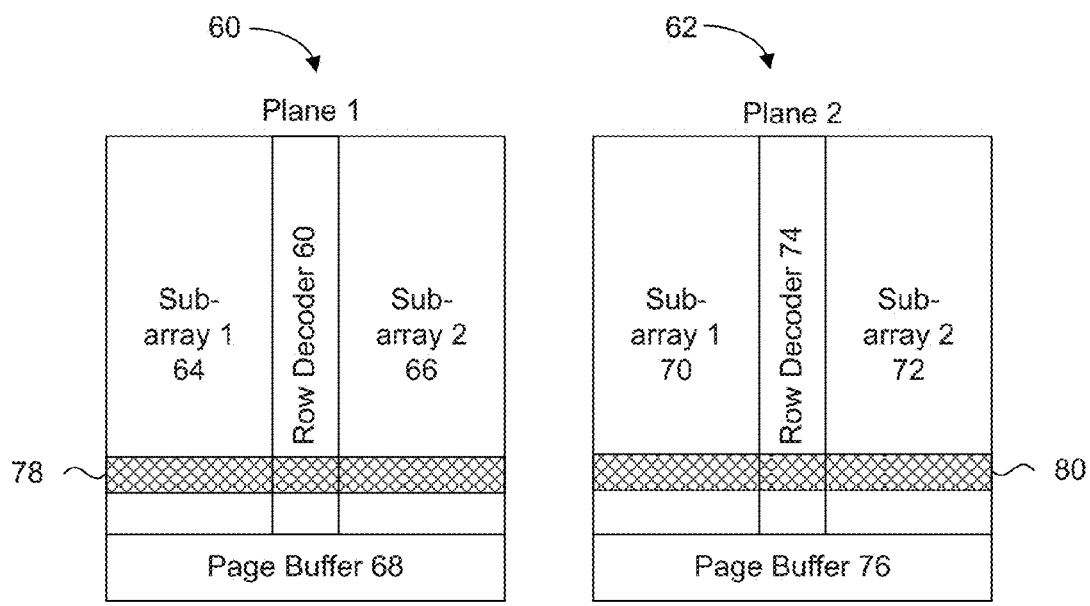
FIG. 3 is a block diagram of a prior art memory array.
Figure 4A:
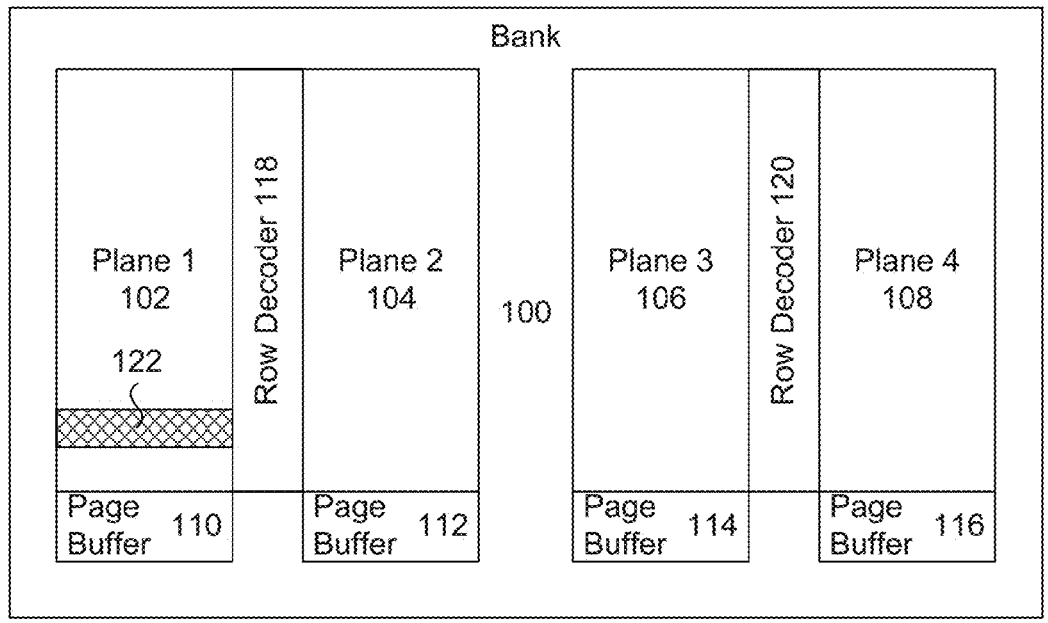
FIG. 4a-4d show different ways of selecting different planes and page buffer units at the same time.

FIGS. 4a to 4d are schematics showing one bank of a flash memory device, where the flash memory device can have any suitable number of banks. The example banks shown in the presently described embodiments can be adapted for use in the device of FIG. 1 as the memory array 38. Alternately, the example banks shown in the presently described embodiments can be adapted for use in memory devices configured for serial operation, such as those described in commonly owned U.S. Patent Publication No. 2007-0076502 filed on Jul. 31, 2006 and titled "DAISY CHAIN CASCADING DEVICES", U.S. Patent Publication No. 2007-0076479 filed on Dec. 30, 2005 and titled "MULTIPLE INDEPENDENT SERIAL LINK MEMORY", and U.S. Patent Publication No. 2007-0153576 filed on Oct. 19, 2006 and titled "MEMORY WITH OUTPUT CONTROL". With reference to FIG. 4a, bank 100 includes four planes 102, 104, 106 and 108 labeled Plane 1, Plane 2, Plane 3 and Plane 4 respectively. Each plane has a corresponding page buffer 110, 112, 114 and 116, which has the same function as page buffer 68 shown in FIG. 3. In order to minimize circuit area, planes 102 and 104 share a common row decoder 118, and similarly, planes 106 and 108 share a common row decoder 120. Although not shown in FIGS. 4a to 4d, planes 102, 104, 106 and 108 each have wordlines extending horizontally from their respective common row decoders 118 and 120, and bitlines that extend vertically from their respective page buffers 110, 112, 114 and 116. In an alternate circuit configuration, each plane can have its respective row decoders arranged on either its right side or left side as dedicated row decoders are not shared with another plane.

In the presently described embodiments, row decoder 118 selectively enables or activates, one wordline in either planes 102 or 104, or one wordline in both planes 102 and 104 during a program, read or erase operation. Row decoder 120 also selectively activates one wordline in either planes 106 or 108, or one wordline in both planes 106 and 108 during the program, read or erase operation. It is noted that there is core control circuitry associated with bank 100 for controlling timing and activation of the circuits therein for program, read and erase operations. Accordingly, all planes in the bank execute the same operation dictated by the core control circuitry.

FIG. 4a shows an example where bank 100 is configured to have a page size equivalent to the page buffer corresponding to a single plane. The single plane page buffer is the minimum page buffer size for the bank, and is referred to from this point on as a page buffer unit. Correspondingly, the minimum page size is one page unit. By example, the smallest page buffer unit size can be 512 k bits in width. In FIG. 4a, one page 122 in plane 102 is selected for a read or program operation. If the operation is an erase operation, then the block containing page 122 is selected for erasure. For the presently described embodiments, the selection of a wordline is analogous to activating the wordline by driving it to a voltage level required for reading, programming or erasing the memory cells it is connected to. Since the page size of bank 100 of FIG. 4a is configured to be one page buffer unit, any page of planes 102, 104, 106 and 108 can be selected for any operation.

Figure 4B:
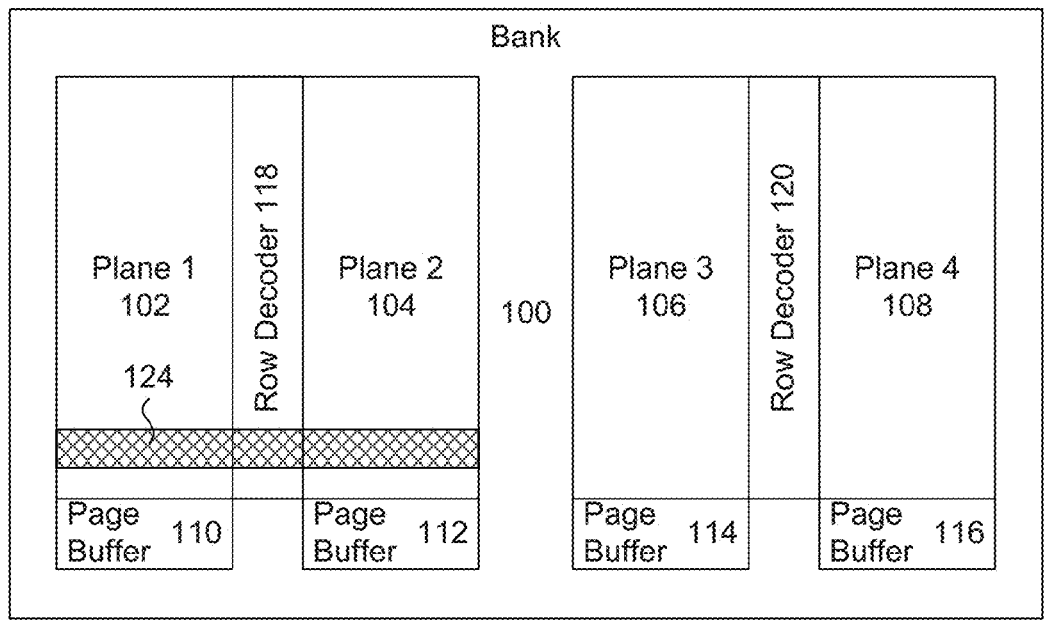

FIG. 4b shows an example where bank 100 is configured to have a page size equivalent to two page buffer units. Accordingly, page 124 spanning planes 102 and 104 are simultaneously selected. Alternately, page 124 can consist of two page units selected from any combination of two planes in bank 100.

Figure 4C:
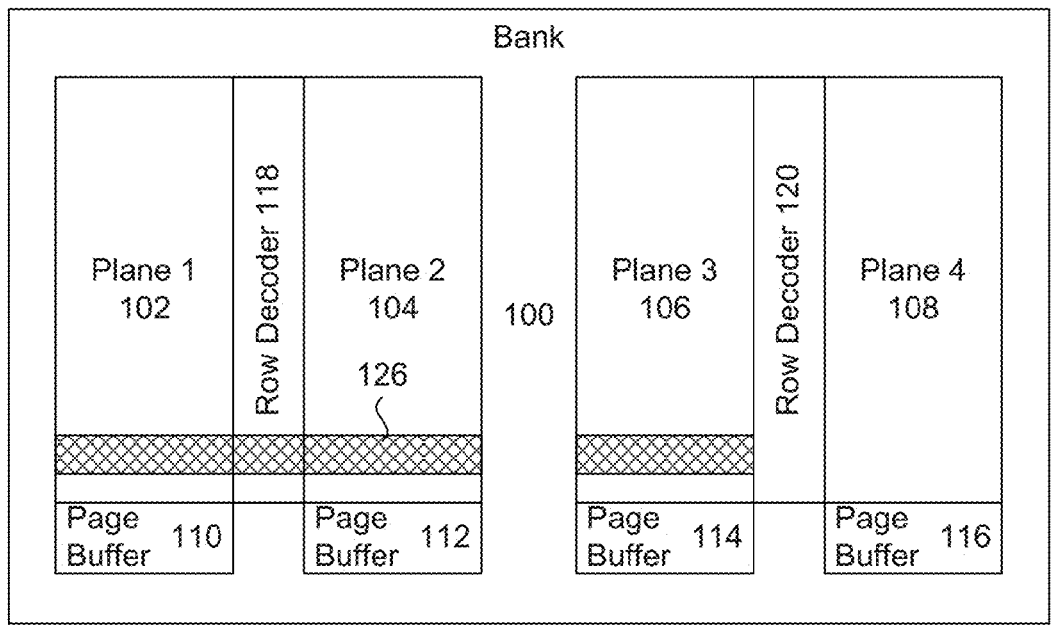

FIG. 4c shows an example where bank 100 is configured to have a page size equivalent to three page buffer units. Accordingly, page 126 spanning planes 102, 104 and 106 are simultaneously selected. Alternately, page 126 can consist of three page units selected from any combination of three planes in bank 100.

Figure 4D:
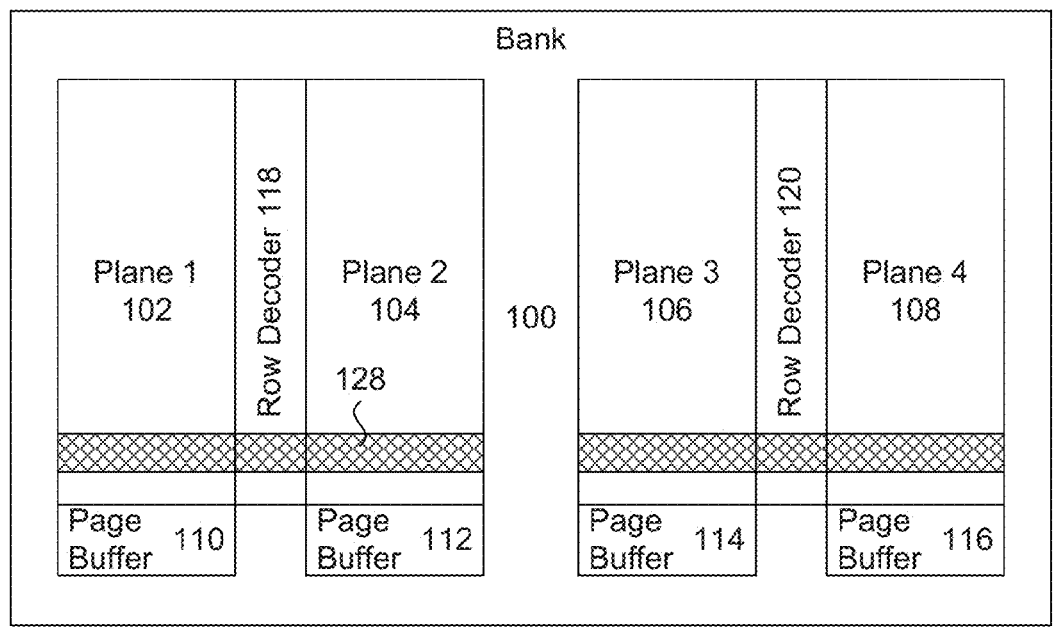

FIG. 4d shows an example where bank 100 is configured to have a page size equivalent to four page buffer units. Accordingly, page 128 spanning planes 102, 104, 106 and 108 are simultaneously selected. As there are only four planes in bank 100, all four page units from the four respective planes are selected at the same time. In FIGS. 4b to 4d, it is assumed that the row decoding logic corresponding to each plane are identical. Therefore one row address received by row decoders 118 and 120 will result in the same physical wordline being activated. In the alternate embodiment where each plane has dedicated row decoders, different physical wordlines can simultaneously be activated in each plane.

Figure 5:
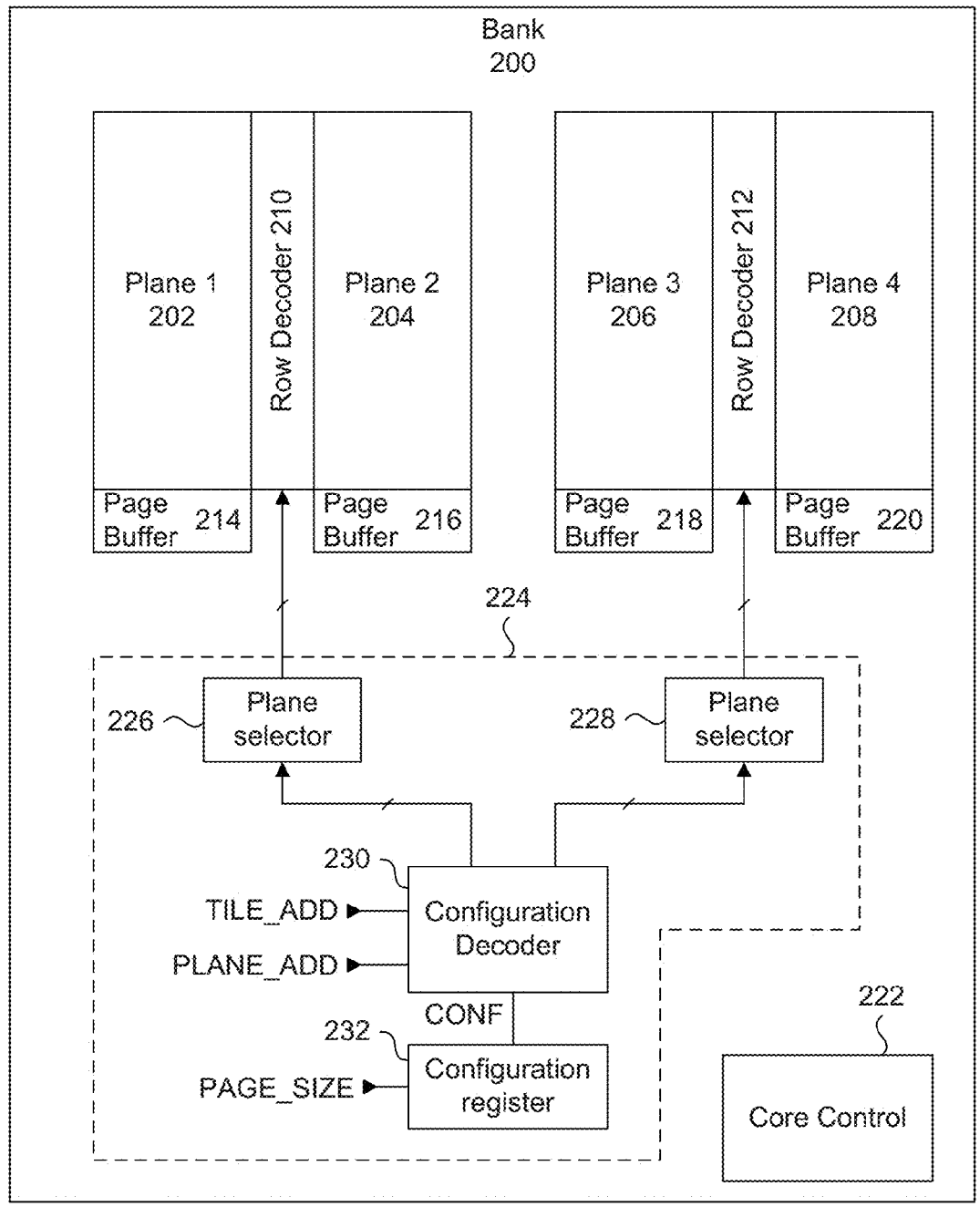
FIG. 5 is a generic embodiment of a memory bank with configurable page size.

FIG. 5 is a block diagram showing functional circuit blocks of one bank in a memory device, according to a presently described embodiment. Bank 200 includes a memory array consisting of four planes 202, 204, 206 and 208, row decoders 210 and 212, and page buffers 214, 216, 218 and 220. From this point onwards, the memory array configuration whereby planes 202 and 204 are arranged on either side of shared row decoder 210 will be referred to as a memory array tile because the semiconductor device can include multiple instances of the same memory array tile. Tiling is a well known design technique for reducing design time of semiconductor memory devices. The row decoders and the page buffers receive address signals provided from address registers (not shown), and other control signals required for controlling the circuits during program, erase and read operations. These control signals are provided by a core control circuit 222. Persons of skill in the art should understand that the core control circuit 222 is responsible for activating the circuits in bank 200 in response to a decoded command received by the memory device. To enable selective page size configuration in bank 200, a page size configurator 224 is included within bank 200. Page size configurator 224 includes a first plane selector 226, a second plane selector 228, and a configuration decoder 230. A configuration register 232 is included for embodiments where the page configuration of the bank is set statically at power up, and dynamically with a dedicated command for specifically configuring the page size of a selected memory bank. A static page configuration means that the page size is fixed for all memory operations until power down or reset of the memory device. The configuration register 232 can be omitted for embodiments where the page size of a memory bank is dynamically configured with a normal flash memory command, such as a read, a program and an erase command for example. This type of dynamic page size configuration can be alternately referred to as on-the-fly dynamic page configuration, where the page size can be changed with each command. For the presently described embodiments, it is assumed that the configuration register 232 is included for static page size configuration and dedicated command dynamic page size configuration.

Bank 200 of FIG. 5 includes the circuit blocks that were previously described in FIGS. 4a to 4d. A discussion of the functional blocks of page size configurator 224 is provided below.

Plane selector 226 provides plane selection signals for selectively enabling row decoder 210 to drive wordlines in one or both of planes 202 and 204. Similarly, plane selector 228 provides plane selection signals for selectively enabling row decoder 212 to drive wordlines in one or both of planes 206 and 208. Both plane selectors 226 and 228 are controlled to operate independently of each other, or controlled to operate identically to each other depending on control signals they receive from the configuration decoder 230. Further discussion of this feature is discussed later.

Configuration decoder 230 includes decoding circuitry for generating the control signals that control plane selectors 226 and 228. These control signals are analogous to enabling signals since they can be used for selectively enabling one or both plane selectors 226 and 228. Configuration decoder 230 generates the control signals in response to a bank address BANK_ADD, a plane address PLANE_ADD and configuration data CONF provided by the configuration register 232. The bank address BANK_ADD is used if there is more than one bank in the memory device that can be selected. The configuration register 232 stores configuration data PAGE_SIZE received externally via data input buffers. As will be discussed later, configuration data PAGE_SIZE can be provided upon power up of the memory device for static configuration of the page size of bank 200, or PAGE_SIZE can be provided during a normal operating period after successful power up, in a received command for dynamic configuration of the page size of bank 200. The configuration register 232 can be any suitable number of bits in size, to suit the number of planes in the bank and the number of planes that can be selected.

The operation of bank 200 is now described with reference to a read operation by example. A read command is provided to the memory device, which includes a read operational code (OP code) and address information corresponding to the desired memory array location of the read data. This address information can include a row address, a column address, a plane address PLANE_ADD and a tile address TILE_ADD. It is assumed that prior to decoding any address information, the configuration register 232 has been loaded with the page size configuration data. The page size configuration data can be loaded during power up of the memory device, or it can be loaded dynamically as part of address information provided with a command. In response to the page size configuration data stored in the configuration register 232, the configuration decoder 230 will change the way it decodes the received PLANE_ADD and TILE_ADD signals. More specifically, configuration decoder 230 changes the logic states of the control signals it provides to the plane selectors 226 and 228 based on the configuration data. Therefore the output of the configuration decoder 230 in response to specific PLANE_ADD and TILE_ADD signals can change depending on the configuration data. This flexibility allows for the page size configurability of the bank.

As previously discussed, each plane selector provides plane selection signals for selectively enabling its corresponding row decoder to drive wordlines in one or both planes it is adjacent to. A description of the row decoders shown in FIG. 5 according to the illustrated embodiment is provided below.

Figure 6:
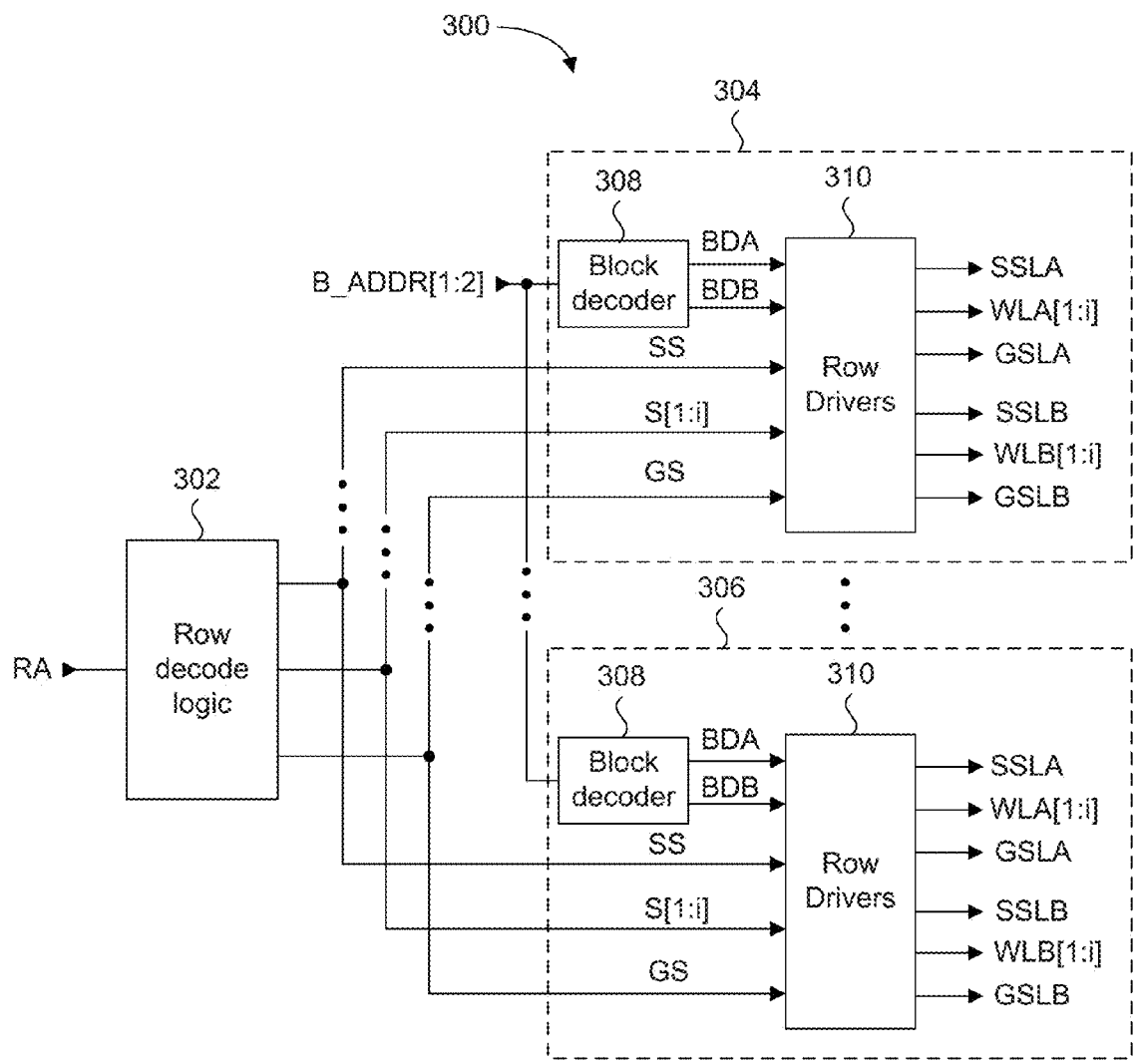
FIG. 6 is a circuit schematic of row decoder/block decoder circuit used in the memory bank of FIG. 5.

FIG. 6 shows a block diagram of either row decoder 210 or 212 shown in FIG. 5. In the presently shown example, row decoder 300 is shared between two adjacent planes in the same tile. Row decoder 300 includes row decode logic 302, and memory block drive circuits 304 and 306 for respective memory blocks. A fabricated flash memory device includes a plurality of memory blocks, such as 1024, 2048 or 4096 memory blocks for example. In this simplified example, each plane has a total of four memory blocks and a total of four memory block drive circuits, two of which are not shown in order to simplify the schematic. Row decode logic 302 receives multi-bit row address RA for generating individual row drive signals such as SS, S[1:i] and GS. In the presently described example, there is one row decode logic 302 for all the memory blocks in the tile, and the row drive signals SS, S[1:i] and GS are global signals provided to all the memory block drive circuits 304 and 306. In particular, global signals SS, GS and S[1:1] correspond respectively to SSL, GSL and wordlines in each memory block drive circuit, such as circuits 304 to 306 for example. Row decode logic 302 includes well known logic circuits for decoding multi-bit row address RA and hence its details need not be presently described.

Memory block drive circuit 304 includes the same circuit elements as memory block drive circuit 306, hence for brevity only the elements for memory block drive circuit 304 are described in further detail. Memory block drive circuit 304 includes a block decoder 308 and row drivers 310. In the example shown in FIG. 6, block decoder 308 of memory block drive circuit 304 receives a two-bit block addresses B_ADDR[1:2] for enabling its corresponding row drivers 310. Accordingly, one block decoder is enabled for any combination of B_ADDR[1:2] to select the memory block for an erase, program or read operation. As previously mentioned, the planes of the present example each have four memory blocks. In a fabricated flash memory device having a plurality of memory blocks, such as 1024, 2048 or 4096 for example, block decoder 308 is configured to receive the appropriate number of block addresses for selecting exactly one of the memory blocks for a memory operation. Row drivers 310 includes devices for passing row drive signals SS, S[1:i] and GS to the NAND cell strings in a memory block of one plane and the NAND cell strings in the memory block of the adjacent plane in the same tile. More specifically, the NAND cell strings in the memory block of one plane receives the row drive signals as SSLA, wordlines WLA[1:i] and GSLA, while the NAND cell strings in the memory block of the adjacent plane receives the row drive signals as SSLB, wordlines WLB[1:i] and GSLB. In the presently described embodiment, the row drive signals can be passed to one of the two planes in the tile, or both planes in the tile simultaneously, in response to signals provided by the block decoder 308.

In response to the multi-bit row address RA, row drive signals SSL, GSL and one wordline WL1 to WLi, are driven to the active logic level such as VDD by row decode logic 302. In response to a block address, only the row drivers 310 of one selected memory block addressed by block addresses B_ADDR[1:2] are enabled for driving or passing the row drive signals SS, S[1:i] and GS to the NAND cell strings in one or both planes of the tile. Because there is exactly one row decode logic 302 for generating one set of row drive signals shared by both planes of the tile, the same physical wordlines in both planes can be driven at the same time when both planes of the tile are selected for an operation by block decoder 308. In an unselected memory block the row drivers 310 are disabled, thereby preventing the NAND cell strings in one or both planes of the tile from receiving the voltage level of row drive signals SS, S[1:i] and GS.

Figure 7:
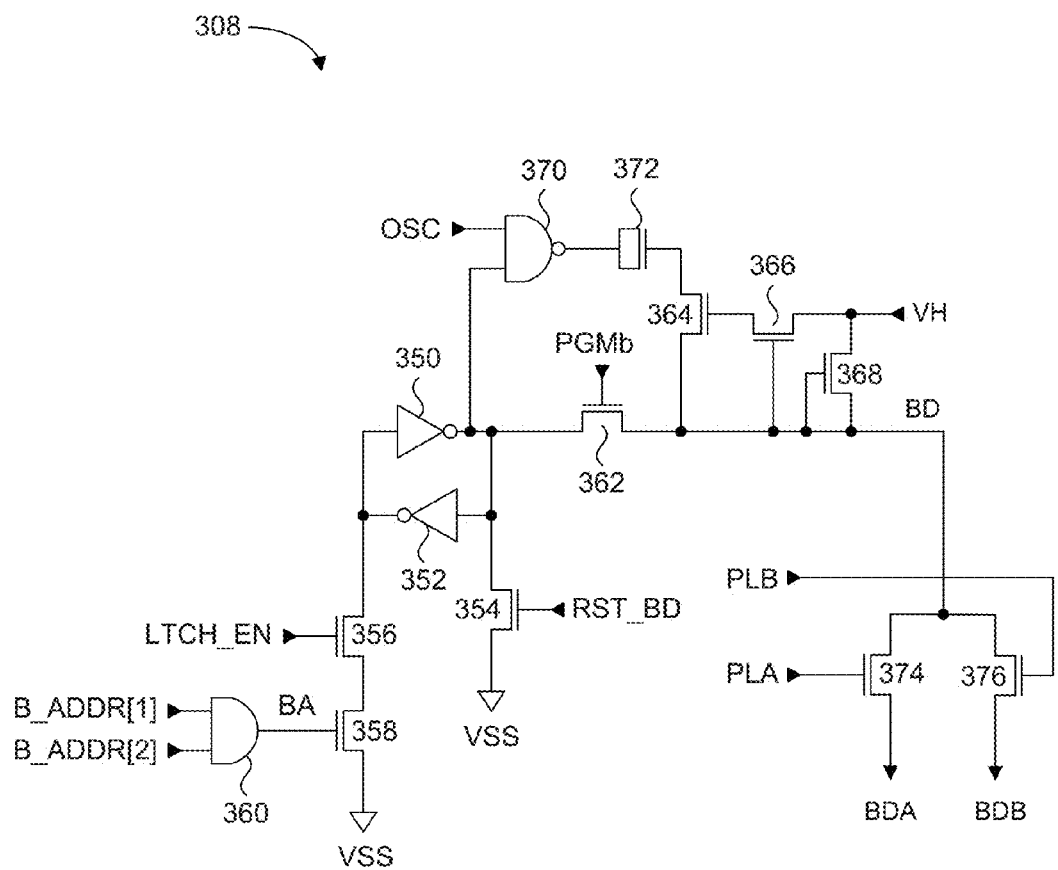
FIG. 7 is a circuit schematic of block decoder circuit shown in FIG. 6

FIG. 7 is a circuit schematic of the block decoder 308 of one memory block drive circuit, such as memory block drive circuit 304, shown in FIG. 6. Block decoder 308 is associated with one memory block, and includes a cross coupled inverter latch circuit and charge pump. The latch circuit includes cross-coupled inverters 350 and 352, an n-channel reset transistor 354, and n-channel enable transistors 356 and 358. The latch circuit is enabled, or set, when latch enable signal LTCH_EN and a decoded block address BA are at the high logic level. Decoded block address BA is also referred to as a block select signal. The decoded block address BA is generated by AND logic gate 360, which receives block addresses B_ADDR[1] and B_ADDR[2]. Those skilled in the art should understand that the AND logic gate 360 for different block decoders 308 of the memory bank is responsive to different logic state combinations of B_ADDR[1] and B_ADDR[2] for selecting one memory block for read, program and erase operations. While not shown, AND logic gates 360 for each block decoder 308 can be set to decode a different combination of B_ADDR[1] and B_ADDR[2] by including different combinations of inverters at its inputs for receiving B_ADDR[1] and B_ADDR[2]. Such decoding schemes are well known in the art. When a reset signal RST_BD is driven to the high logic level, of VDD for example, reset transistor 354 is turned on to couple the input of inverter 352 to VSS. This results in the latch circuit of inverters 350 and 352 to be reset.

The block decoder 308 includes a local charge pump coupled to the output of inverter 350. The charge pump includes a depletion mode n-channel pass transistor 362, a native n-channel diode-connected boost transistor 364, a high breakdown voltage n-channel decoupling transistor 366, a high breakdown voltage n-channel clamp transistor 368, a NAND logic gate 370, and a capacitor 372. NAND logic gate 370 has one input terminal coupled to the output of inverter 350 and another input terminal for receiving controlled signal OSC, for driving one terminal of capacitor 372. Pass transistor 362 is controlled by the complement of a program signal PGM, referred to as PGMb. The common terminals of decoupling transistor 366 and clamp transistor 368 are coupled to high voltage VH. The output voltage BD is connected to a selection circuit consisting of n-channel pass transistors 374 and 376 connected in parallel to master output voltage BD. Pass transistor 374 is controlled by plane selector signal PLA to pass BD as BDA while pass transistor 376 is controlled by plane selector signal PLB to pass BD as BDB. Signals PLA and PLB are provided by a respective plane selector, such as plane selector 226 of FIG. 5. Accordingly, for any operation one or both of BDA and BDB can have the master output voltage BD. It is noted that plane selector signals PLA and PLB have voltage levels which are high enough to enable the n-channel pass transistors 374 and 376 to fully pass BD so that the voltage levels of BDA and BDB equal BD. For example, if BD is approximately a program voltage Vpgm+Vtn, where Vtn is a threshold voltage of an n-channel transistor, then PLA and PLB should be at least Vpgm+2Vtn. Thus BDA and BDB can be equal to BD.

The operation of the charge pump is now described. During a read or erase operation, PGMb is at the high logic level and OSC is maintained at the low logic level. Therefore, circuit elements 372, 364, 366 and 368 are inactive, and the output terminal BD reflects the logic level appearing on the output of inverter 350. During a program operation, PGMb is at the low logic level, and OSC is allowed to oscillate between the high and low logic levels at a predetermined frequency. If the output of inverter 350 is at the high logic level, then capacitor 372 will repeatedly accumulate charge on its other terminal and discharge the accumulated charge through boost transistor 364. Decoupling transistor 366 isolates VH from the boosted voltage on the gate of boost transistor 364. Clamp transistor 368 maintains the voltage level of output terminal BD at about VH+Vtn, where Vtn is the threshold voltage of clamp transistor 368. The local charge pump shown in FIG. 7 is one example circuit which can be used to drive signals to a voltage levels higher than the supply voltage VDD, but persons skilled in the art will understand other charge pump circuits can be used with equal effectiveness.

Figure 8:
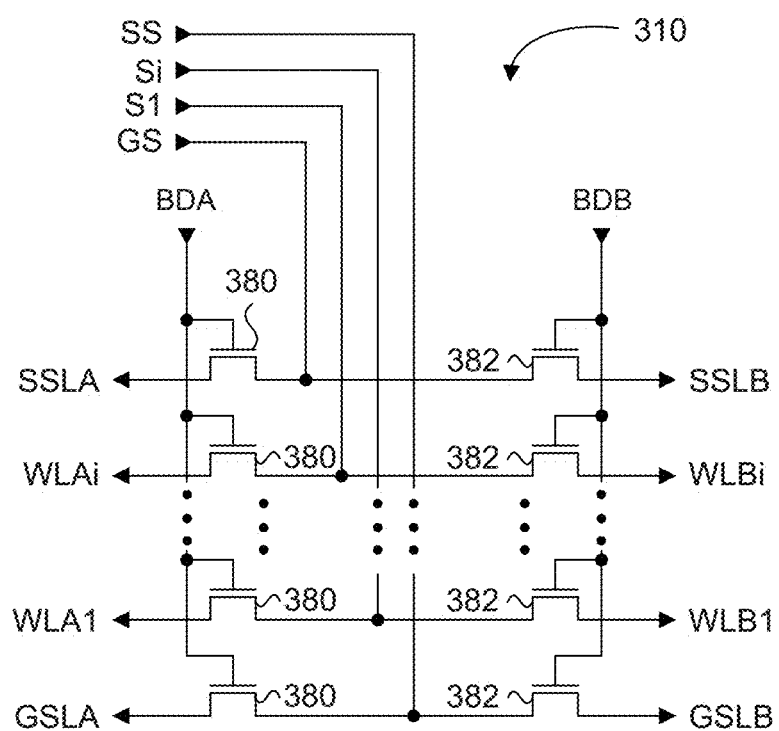
FIG. 8 is a circuit schematic of a row driver shown in FIG. 6

FIG. 8 is a circuit schematic of a row driver 310 of FIG. 6. Row drivers 310 includes a first set of n-channel pass transistors 380 and second set of n-channel pass transistors 382. Both sets of pass transistors 380 and 382 pass the row drive signals SS, S[1:i] and GS to the NAND cell strings of one or two planes of the tile. More specifically, signals SS, S[1:i] and GS are passed by the first set of n-channel pass transistors 380 as signals SSLA, wordlines WLA[1:i] and GSLA in response to voltage BDA, and by the second set of n-channel pass transistors 382 as signals SSLB, wordlines WLB[1:i] and GSLB in response to voltage BDB. In operation, when BDA is driven above VDD, then row drive signals SS, S[1:i] and GS greater than VDD can be passed onto SSLA, WLA[1:i] and GSLA lines, respectively. If BDA is at VSS, then the pass transistors 380 will be turned off to decouple the row drive signals SS, S[1:i] and GS from SSLA, WLA[1:i] and GSLA, respectively. The operation is identical for BDB and pass transistors 382.

The previously described circuit examples of FIGS. 6, 7 and 8 are directed to a shared row decoder architecture that may minimize circuit area overhead in view of circuit duplication for each plane being obviated. The trade-off for the circuit area savings obtained using the shared row decoder architecture is the inability to select different wordlines in both planes of the same tile. This is due to the fact that there is one row decode logic 302 for providing one set of row drive signals shared by both planes of the tile. In contemplated alternative examples where conservation of circuit area may be less of an issue, a dedicated row decoder architecture can be used instead. In a dedicated row decoder architecture, there is one row decoder 300 for each plane, thereby allowing for simultaneous selection of both adjacent planes of a tile while selecting different wordlines to drive in each plane. The primary modifications for converting row decoder 300 to a dedicated row decoder for one plane includes configuring block decoder 308 to provide only one of BDA or BDB, and configuring row driver 310 to provide only one of the two sets of row drive signals SSLA, WLA[1:i], GSLA and SSLB, WLB [1:i], GSLB. The row decoder for the other plane has a block decoder configured for providing the other of BDA or BDB and a row driver 310 configured for providing the other set of SSLA, WLA[1:i], GSLA and SSLB, WLB[1:i], GSLB. For clarity and consistency, various circuit embodiments are subsequently described with the assumption that a shared row decoder is used for each tile.

Figure 9:
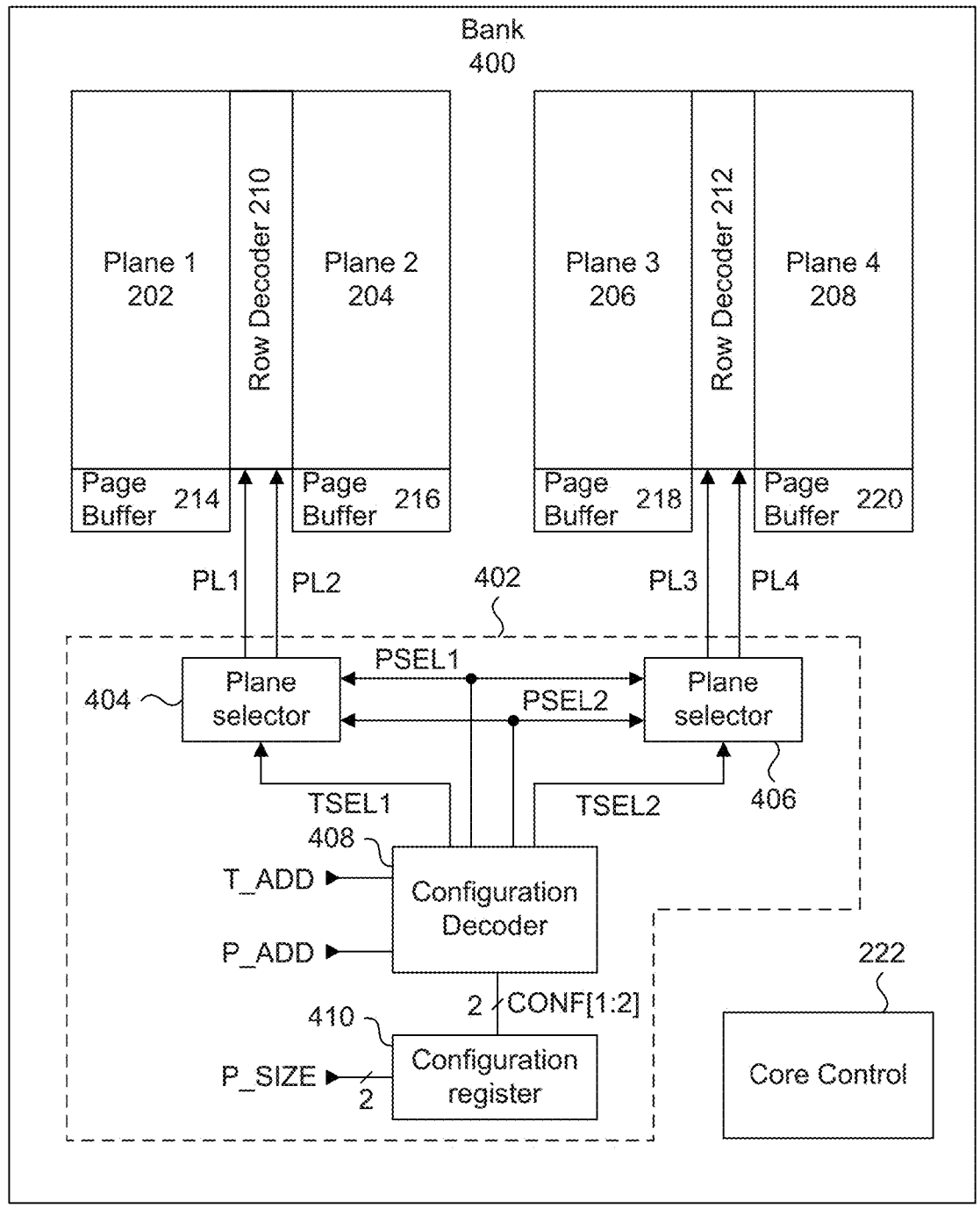
FIG. 9 is a block diagram of a memory bank with fixed plane configurable page size according to a present embodiment.

While FIG. 5 illustrates a general embodiment of a memory bank having a configurable page size, FIG. 9 presents one example configurable page size architecture for one bank of a memory device. In the example of FIG. 9, bank 400 includes the same planes 202, 204, 206, and 208, row decoders 210 and 212, page buffers 214, 216, 218 and 220, and core control circuitry 222. The page size configurator 402 on the other hand, is specifically configured to select specific planes in response to page configuration data, plane address information and bank address information. Generally, page size configurator 402 statically or dynamically configures bank 400 to have a page size that is either one page buffer unit, two page buffer units or four page buffer units in size. A detailed description of the functional circuits blocks of page size configurator 402 is provided below.

Page size configurator 402 includes a first plane selector 404, a second plane selector 406, a configuration decoder 408, and a configuration register 410. The configuration register 410 receives and stores page size configuration data P_SIZE, which in the presently described example consists of two bits. In the presently described embodiments, P_SIZE is provided through the input/output interface of the memory device in a predetermined command that is decoded by an internal command register (not shown), that routes the bits of P_SIZE to the configuration register 410. As previously mentioned, such a command can be provided at power up, or alternately, dynamically in between normal operation commands. For the presently shown example of FIG. 9 where there are a total of four planes grouped into two memory array tiles, one bit of P_SIZE is used for configuring memory array tile selection and a second bit of P_SIZE is used for configuring plane selection. This first bit is referred to as CONF1 and the second bit is referred to as CONF2, which are provided to configuration decoder 408 as signal bus CONF[1:2].

Configuration decoder 408 includes configurable logic decoding gates that receive a tile address bit T_ADD and a plane address bit P_ADD for generating decoded tile enabling signals TSEL1 and TSEL2, and plane enabling signals PSEL1 and PSEL2. The configurable logic decoding gates within configuration decoder 408 are controlled by CONF1 and CONF2 to change the logic states of TSEL1, TSEL2, PSEL1 and PSEL2 for any given logic states of the tile address bit T_ADD and the plane address bit P_ADD.

As shown in FIG. 9, TSEL1 is provided to first plane selector 404, TSEL2 is provided to second plane selector 406, while PSEL1 and PSEL2 are provided to both plane selectors 404 and 406. First plane selector 404 generates row decoder enabling signals PL1 and PL2 in response to TSEL1, PSEL1 and PSEL2. Second plane selector 406 generates row decoder enabling signals PL3 and PL4 in response to TSEL2, PSEL1 and PSEL2. Configuration decoder 408 functions as a first level decoder, while first and second plane selectors 404 and 406 function as second level decoders. In the presently shown example configuration, first plane selector 404 is enabled when TSEL1 is at the active logic level and second plane selector 406 is enabled when TSEL2 is at the active logic level. First plane selector 404 drives PL1 to the active logic level in response to PSEL1 at the active logic level, and drives PL2 to the active logic level in response to PSEL2 at the active logic level. Similarly, second plane selector 406 drives PL3 to the active logic level in response to PSEL1 at the active logic level, and drives PL4 to the active logic level in response to PSEL2 at the active logic level. Then row decoders 210 and 212 drive the wordlines in the selected planes in response to active logic levels of PL1, PL2, PL3 and PL4. With reference to the block decoder 308 of FIG. 7, signals PL1 and PL2 are logically equivalent to PLA and PLB respectively, and signals PL3 and PL4 are logically equivalent to PLA and PLB respectively. Persons skilled in the art will appreciate that bank 400 can be scaled to include more than two memory array tiles, which thus necessitates additional plane selectors, addressing bits and more bits for the page size configuration data.

Figure 10:
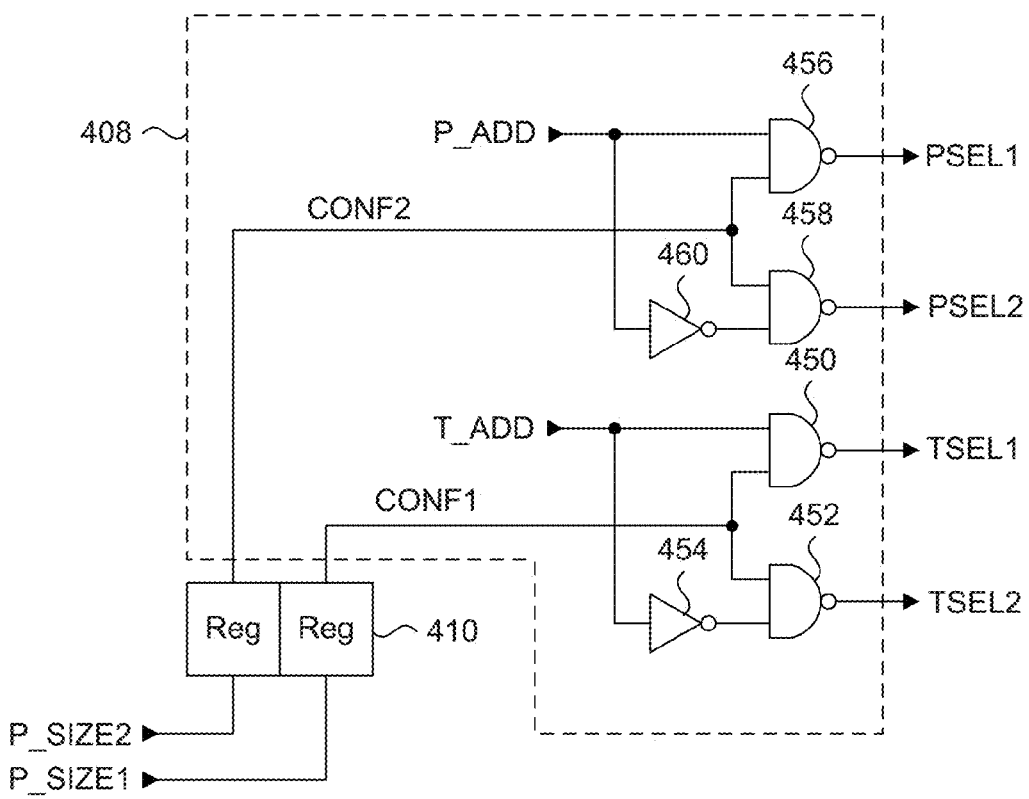
FIG. 10 is a circuit schematic of the configuration decoder shown in FIG. 9.

FIG. 10 is a circuit schematic of configuration decoder 408 and configuration register 410 shown in FIG. 9, according to a presently described embodiment. Configuration register 410 in the presently described example is a two-bit register, where each register can be any suitable data storage circuit. Configuration register 410 receives and stores P_SIZE1 and P_SIZE2, and provides corresponding bits CONF1 and CONF2 respectively. In the presently described example, CONF1 is used for configuring memory array tile selection while CONF2 is used for configuring plane selection. Configuration decoder 408 includes two independently operating decoding circuits. The first decoding circuit is the tile decoding circuit consisting of NAND logic gates 450 and 452, and inverter 454. The second decoding circuit is the plane decoding circuit consisting of NAND logic gates 456 and 458, and inverter 460.

In the tile decoding circuit, NAND logic gate 450 receives tile address T_ADD and configuration bit CONF1 for providing decoded tile enabling signal TSEL1. NAND logic gate 452 receives the complement of tile address T_ADD via inverter 454 and configuration bit CONF1 for providing decoded tile enabling signal TSEL2. As should be apparent to any person of skill in the art, both NAND logic gates 450 and 452 are enabled when CONF1 is at the active high logic level, thereby enabling them to drive one of TSEL1 and TSEL2 to the active high logic level in response to T_ADD.

In the plane decoding circuit, NAND logic gate 456 receives plane address P_ADD and configuration bit CONF2 for providing decoded plane enabling signal PSEL1. NAND logic gate 458 receives the complement of plane address P_ADD via inverter 460 and configuration bit CONF2 for providing decoded plane enabling signal PSEL2. As should be apparent to any person of skill in the art, both NAND logic gates 456 and 458 are enabled when CONF2 is at the active high logic level, thereby enabling them to drive one of PSEL1 and PSEL2 to the active high logic level in response to P_ADD. Table 1 below summarizes the functional operation of configuration decoder 408 in response to the different logic level combinations of CONF1 and CONF2. In an alternative example, the logic gates of configuration decoder 408 can be configured to decode inverted versions of CONF1 and CONF2. For example, when CONF1 and CONF2 are both at the "0" logic state, 1 page buffer unit is selected as the minimum page size.

TABLE 1

| CONF1 | CONF2 | Tile selection | Plane selection | Minimum Page size |
|---|---|---|---|---|
| 1 | 1 | Enabled | Enabled | 1 page buffer unit |
| 1 | 0 | Enabled | Disabled | 2 page buffer units |
| 0 | 1 | Disabled | Enabled | 2 page buffer units |
| 0 | 0 | Disabled | Disabled | 4 page buffer units |

Figure 11:
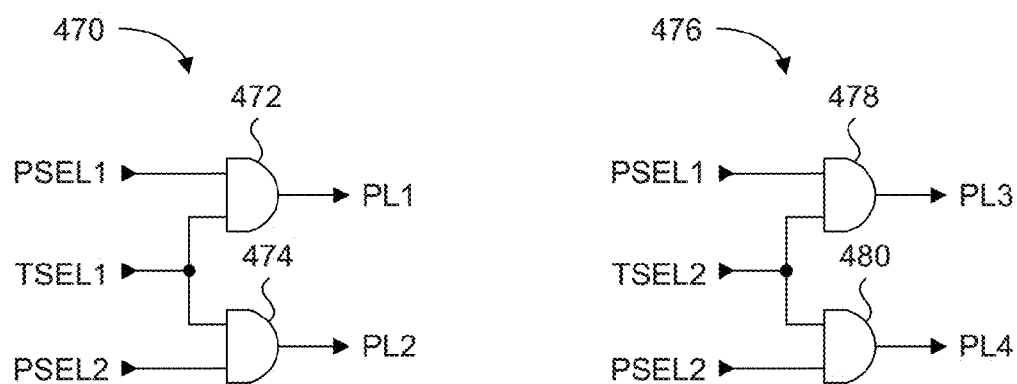
FIG. 11 shows circuit schematics of the plane selectors shown in FIG. 9.

The outputs of configuration decoder 408 are provided to plane selectors 404 and 406. FIG. 11 is a circuit schematic of decoding circuits that can be used for plane selectors 404 and 406. Plane selector 470 includes two AND logic gates 472 and 474 which can be used in plane selector 404 of FIG. 9. AND logic gate 472 has a first input for receiving PSEL1 and a second input for receiving TSEL1. AND logic gate 474 has a first input for receiving PSEL2 and a second input for receiving TSEL1. The output of AND logic gate 472 drives signal PL1 while the output of AND logic gate 474 drives signal PL2. Plane selector 476 includes two AND logic gates 478 and 480 which can be used in plane selector 406 of FIG. 9. AND logic gate 478 has a first input for receiving PSEL1 and a second input for receiving TSEL2. AND logic gate 480 has a first input for receiving PSEL2 and a second input for receiving TSEL2. The output of AND logic gate 478 drives signal PL3 while the output of AND logic gate 480 drives signal PL3.

As shown in Table 1, bank 400 can be statically or dynamically configured to have a page width of either 1, 2 or 4 page buffer units. However, different combinations of planes can be selected to provide the 1 and 2 page buffer unit page sizes. With reference to the circuits of FIGS. 10 and 11, the 1 page buffer unit page size configuration is selected by setting both CONF1 and CONF2 to the "1" logic state. This allows PSEL1, PSEL2, TSEL1 and TSEL2 to be driven to different logic levels in response to P_ADD and T_ADD. More specifically, one of TSEL1 and TSEL2 is driven to the active logic state in response to T_ADD, while one of PSEL1 and PSEL2 is driven to the active logic state in response to P_ADD. Following the decoding logic in plane selector 470 of FIG. 11, only one of plane selectors 404 and 406 of FIG. 9 are enabled. In the enabled plane selector, only one of PL1 and PL2 (or PL3 and PL4) is driven to the active logic level in response to either PSEL1 or PSEL2. Accordingly, any one of planes 202, 204, 206 and 208 can be addressed for a read, program or erase operation.

For a 2 page buffer unit page size configuration, two different configuration settings can be used. In both settings, CONF1 and CONF2 are at complementary logic states, as shown in Table 1. While both settings achieve the same end result, different combinations of planes are selected. Looking at the first setting, CONF1 at the "1" logic state enables tile selection while CONF2 at the "0" logic state disables plane selection. In FIG. 10, NAND logic gates 456 and 458 are disabled and both PSEL1 and PSEL2 are set to the high logic states. Therefore P_ADD is inhibited from being decoded. Because only one of TSEL1 and TSEL2 is driven to the active logic level in response to T_ADD, both PL1 and PL2 (or PL3 and PL4) are driven to the active logic level via the logic of plane selector 470. Therefore, both planes in one tile are simultaneously selected. Therefore this configuration setting only allows for a 2 page buffer unit combination consisting of planes in the same tile.

Looking at the second setting, CONF1 at the "0" logic state disables tile selection while CONF2 at the "1" logic state enables plane selection. In FIG. 10, NAND logic gates 450 and 452 are disabled resulting in both TSEL1 and TSEL2 being set to the high logic states. Therefore T_ADD is inhibited from being decoded, and both plane selectors 404 and 406 are enabled. Because only one of PSEL1 and PSEL2 is driven to the active logic level in response to P_ADD, only the pairing of PL1 and PL3 or PL2 and PL4 are driven to the active logic level via the logic of plane selector 470. In otherwords, only the left or right planes of both tiles are simultaneously selected in this configuration setting.

For a 4 page buffer unit page size configuration, both CONF1 and CONF2 are at the "0" logic state. In FIG. 10, NAND logic gates 450, 452, 456 and 458 are disabled, thus resulting PSEL1, PSEL2, TSEL1 and TSEL2 being set to the high logic states. Therefore P_ADD and T_ADD are inhibited from being decoded. Both plane selectors 404 and 406 are enabled and row decoder enabling signals PL1, PL2, PL3 and PL4 are driven to the active logic level to simultaneously select all four planes in bank 400. If the memory device has multiple banks, then a bank address can be provided to selectively enable the circuits of bank 400 since addresses P_ADD and T_ADD are not used by configuration decoder 408.

In the previously described examples of the 1, 2 and 4 page buffer unit size configurations, the addresses P_ADD and T_ADD can be provided in the command with or without knowledge of the configuration of the page size for bank 400. For example, the memory controller maintains a mapping of the page sizes to the corresponding addresses. This means that only the addresses to be decoded by configuration decoder 408 need to be provided, while the other addresses are statically held at an inactive voltage level.

Although bank 400 can be configured to have different page sizes, it does not allow for a page size of 3 page buffer units, nor does it provide full flexibility for selecting any combination of 2 page buffer units. For example, planes 204 and 206 cannot be simultaneously selected, and planes 202 and 208 cannot be simultaneously selected. There may be circumstances where different combinations of planes should be selected, such as for example, when a memory controller follows a wear leveling algorithm. Those skilled in the art understand that wear leveling is a known technique for maximizing the endurance of a memory device by balancing the program and erase operations across all memory tiles or planes of the bank.

The previously presented example embodiment of FIG. 10 includes configuration register 410 for receiving the bits of page size configuration data P_SIZE. For the alternate embodiment where on-the-fly dynamic page size configuration is used, configuration register 410 is omitted, and P_SIZE1 and P_SIZE2 are connected directly to lines CONF1 and CONF2 respectively. Accordingly, as the operational command is decoded, P_SIZE1 and P_SIZE2 are directly fed to configuration decoder 408.

Figure 12:
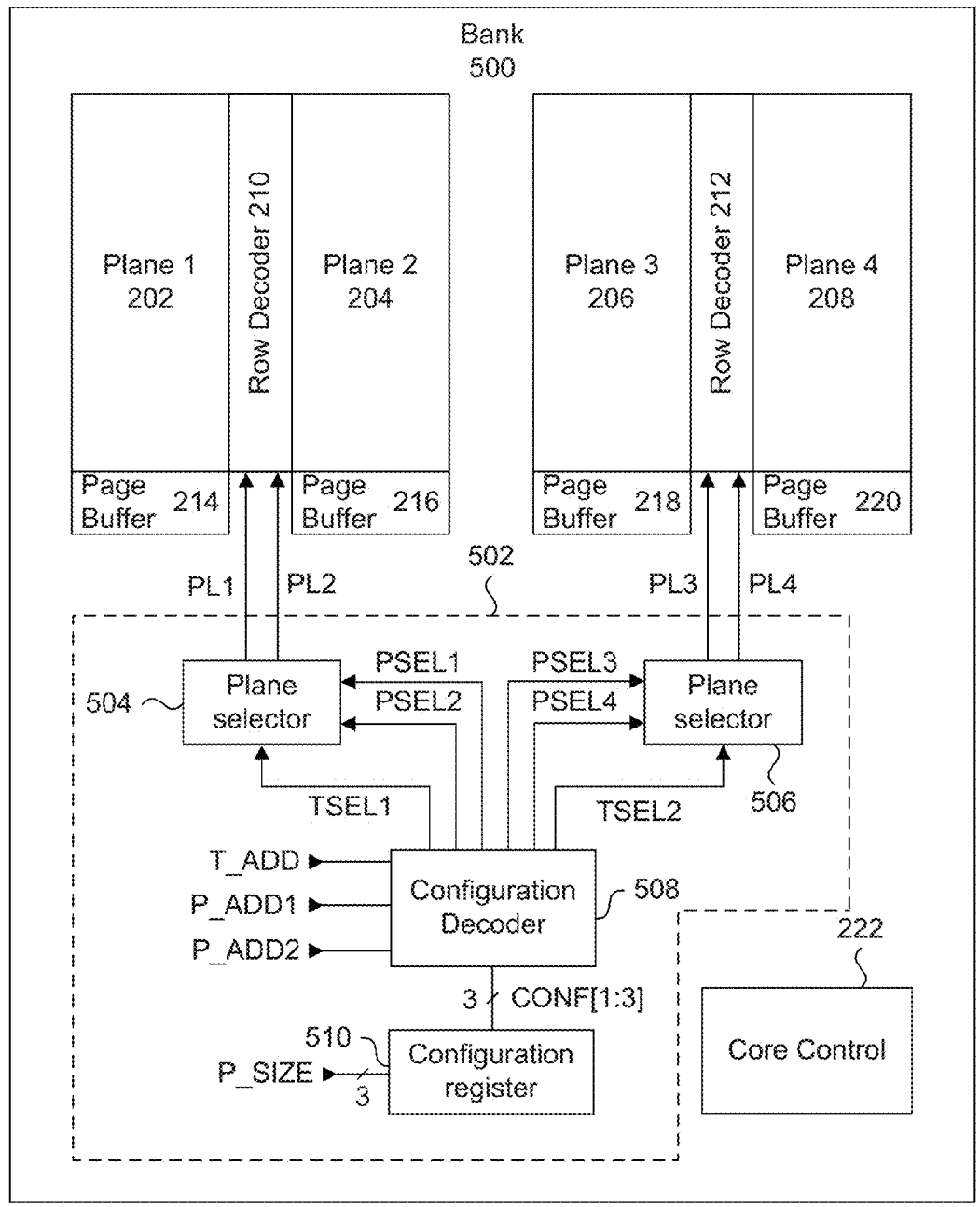
FIG. 12 is a block diagram of a memory bank with flexible plane configurable page size according to a present embodiment.

FIG. 12 presents another example configurable page size architecture for one bank of a memory device. In the example of FIG. 12, bank 500 includes the same planes 202, 204, 206, and 208, row decoders 210 and 212, page buffers 214, 216, 218 and 220, and core control circuitry 222. The page size configurator 502 on the other hand, is specifically configured to select specific planes in response to page configuration data, plane address information and bank address information. Page size configurator 502 statically or dynamically configures bank 500 to have a page size that is either one page buffer unit, two page buffer units, three page buffer units or four page buffer units in size. In the presently shown example, any combination of page buffer units can be selected for page sizes of 2 and 3 page buffer units. A detailed description of the functional circuit blocks of page size configurator 502 is provided below.

Page size configurator 502 includes a first plane selector 504, a second plane selector 506, a configuration decoder 508, and a configuration register 510. The configuration register 510 receives and stores page size configuration data P_SIZE, which in the presently described example consists of three bits. For the presently shown example of FIG. 12 where there are a total of four planes grouped into two memory array tiles, one bit of P_SIZE is used for configuring memory array tile selection and two bits of P_SIZE are used for configuring plane selection. This first bit is referred to as CONF1 and the second and third bits is referred to as CONF2 and CONF3, which are provided to configuration decoder 508 as signal bus CONF[1:3]. Configuration decoder 508 includes configurable logic decoding gates that receive a tile address bit T_ADD and two plane address bits P_ADD1 and P_ADD2 for generating decoded tile enabling signals TSEL1 and TSEL2, and plane enabling signals PSEL1, PSEL2, PSEL3 and PSEL4. The configurable logic decoding gates within configuration decoder 508 are controlled by CONF1, CONF2 and CONF3 to change the logic states of TSEL1, TSEL2, PSEL1, PSEL2, PSEL3 and PSEL4 for any given logic states of tile address bit T_ADD and a plane address bits P_ADD1 and P_ADD2.

As shown in FIG. 12, TSEL1 is provided to first plane selector 504, TSEL2 is provided to second plane selector 506, while PSEL1, PSEL2 are provided to first plane selector 504 and PSEL3, PSEL4 are provided to second plane selector 506. First plane selector 504 generates row decoder enabling signals PL1 and PL2 in response to TSEL1, PSEL1 and PSEL2. Second plane selector 506 generates row decoder enabling signals PL3 and PL4 in response to TSEL2, PSEL3 and PSEL4. Configuration decoder 508 functions as a first level decoder, while first and second plane selectors 504 and 506 function as second level decoders. In the presently shown example configuration, first plane selector 504 is enabled when TSEL1 is in the active logic level and second plane selector 506 is enabled with TSEL2 is at the active logic level. First plane selector 504 drives PL1 to the active logic level in response to PSEL1 at the active logic level, and drives PL2 to the active logic level in response to PSEL2 at the active logic level. Similarly, second plane selector 506 drives PL3 to the active logic level in response to PSEL1 at the active logic level, and drives PL4 to the active logic level in response to PSEL2 at the active logic level. Then row decoders 210 and 212 drive the wordlines in the selected planes in response to active logic levels of PL1, PL2, PL3 and PL4. With reference to the block decoder 308 of FIG. 7, signals PL1 and PL2 are logically equivalent to PLA and PLB respectively, and signals PL3 and PL4 are logically equivalent to PLA and PLB respectively. Persons skilled in the art will appreciate that bank 500 can be scaled to include more than two memory array tiles, which thus necessitates additional plane selectors, addressing bits and more bits for the page size configuration data.

Figure 13:
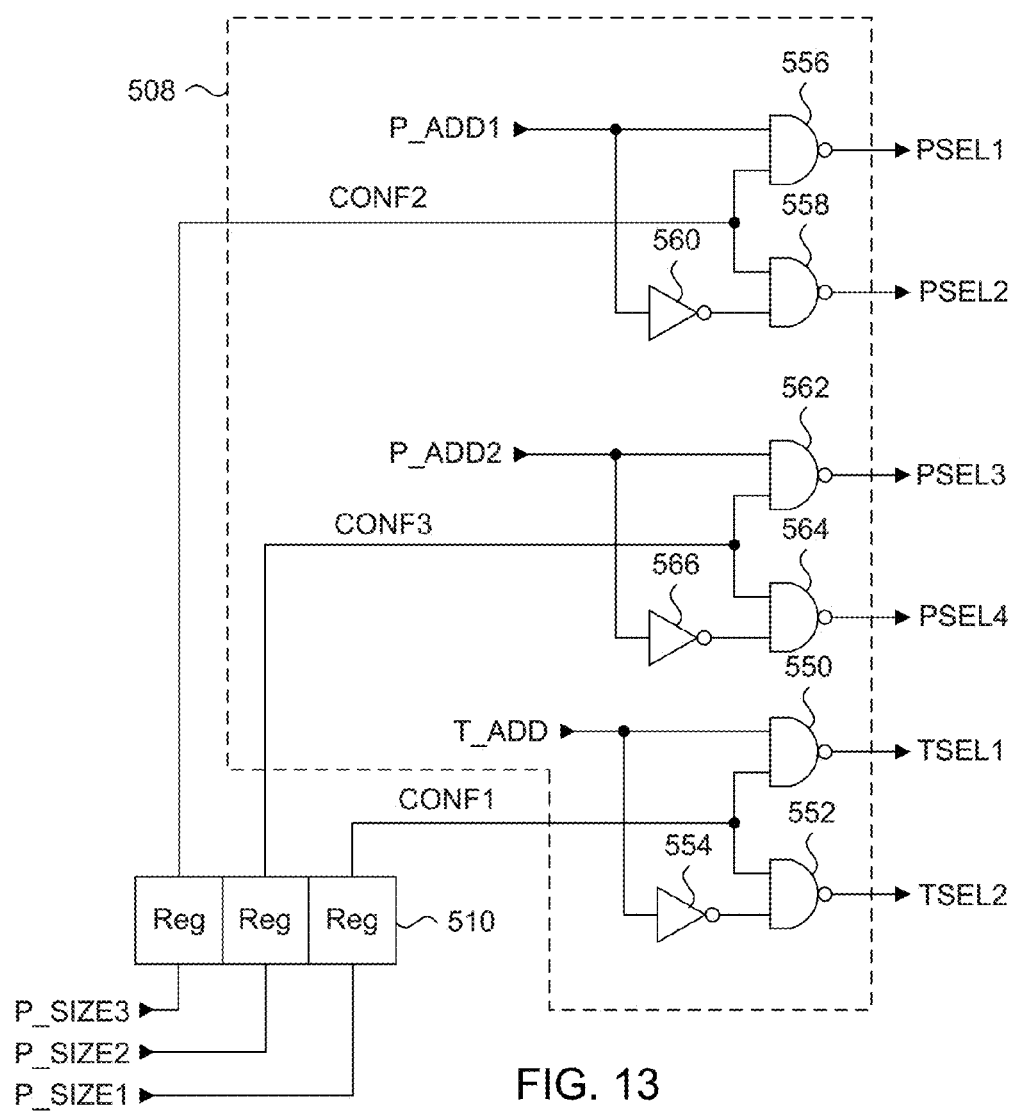
FIG. 13 is a circuit schematic of the configuration decoder shown in FIG. 12.

FIG. 13 is a circuit schematic of configuration decoder 508 and configuration register 510 shown in FIG. 12, according to a presently described embodiment. Configuration register 510 in the presently described example is a three-bit register, where each register can be any suitable data storage circuit. Configuration register 510 receives and stores P_SIZE1, P_SIZE2, and P_SIZE3, and provides corresponding bits CONF1, CONF2, and CONF3 respectively. In the presently described example, CONF1 is used for configuring memory array tile selection, CONF2 is used for configuring plane selection in a first tile and CONF3 is used for configuring plane selection in a second tile. In the presently described example, the first tile includes planes 202 and 204 and the second tile includes planes 206 and 208. Configuration decoder 508 includes three independently operating decoding circuits. The first decoding circuit is the tile decoding circuit consisting of NAND logic gates 550 and 552, and inverter 554. The second decoding circuit is the plane decoding circuit consisting of NAND logic gates 556 and 558, and inverter 560. The third decoding circuit is the plane decoding circuit consisting of NAND logic gates 562 and 564, and inverter 566.

In the tile decoding circuit, NAND logic gate 550 receives tile address T_ADD and configuration bit CONF1 for providing decoded tile enabling signal TSEL1. NAND logic gate 552 receives the complement of tile address T_ADD via inverter 554 and configuration bit CONF1 for providing decoded tile enabling signal TSEL2. As should be apparent to any person of skill in the art, both NAND logic gates 550 and 552 are enabled when CONF1 is at the active high logic level, thereby enabling them to drive one of TSEL1 and TSEL2 to the active high logic level in response to T_ADD.

In the first plane decoding circuit, NAND logic gate 556 receives plane address P_ADD1 and configuration bit CONF2 for providing decoded plane enabling signal PSEL1. NAND logic gate 558 receives the complement of plane address P_ADD1 via inverter 560 and configuration bit CONF2 for providing decoded plane enabling signal PSEL2. As should be apparent to any person of skill in the art, both NAND logic gates 556 and 558 are enabled when CONF2 is at the active high logic level, thereby enabling them to drive one of PSEL1 and PSEL2 to the active high logic level in response to P_ADD1. In the second plane decoding circuit, NAND logic gate 562 receives plane address P_ADD2 and configuration bit CONF3 for providing decoded plane enabling signal PSEL3. NAND logic gate 564 receives the complement of plane address P_ADD2 via inverter 566 and configuration bit CONF3 for providing decoded plane enabling signal PSEL4.

Figure 14:
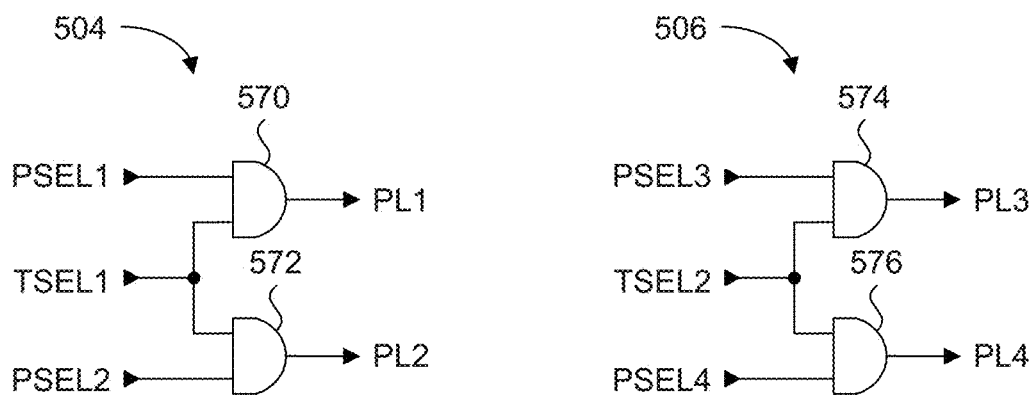
FIG. 14 shows circuit schematics of the plane selectors shown in FIG. 12.

The outputs of configuration decoder 508 are provided to plane selectors 504 and 506. FIG. 14 shows circuit schematics of decoding circuits that can be used for plane selectors 504 and 506 respectively. Plane selector 504 includes two AND logic gates 570 and 572. AND logic gate 570 has a first input for receiving PSEL1 and a second input for receiving TSEL1. AND logic gate 572 has a first input for receiving PSEL2 and a second input for receiving TSEL1. The output of AND logic gate 570 drives signal PL1 while the output of AND logic gate 572 drives signal PL2. Plane selector 506 includes two AND logic gates 574 and 576. AND logic gate 574 has a first input for receiving PSEL3 and a second input for receiving TSEL2. AND logic gate 576 has a first input for receiving PSEL4 and a second input for receiving TSEL2. The output of AND logic gate 574 drives signal PL3 while the output of AND logic gate 576 drives signal PL4.

Table 2 below summarizes the functional operation of configuration decoder 508 in response to the different logic level combinations of CONF1, CONF2, CONF3, P_ADD1, P_ADD2, and T_ADD. Once again, configuration decoder 508 can be designed to decode inverted versions of any one or more of CONF1, CONF2 and CONF3 while providing the same decoded result.

TABLE 2

| CONF1 | CONF2 | CONF3 | Minimum Page size | Selected Plane |
|---|---|---|---|---|
| 1 | 1 | 1 | 1 page buffer unit | Any plane |
| 1 | 1 | 0 | Invalid | N/A |
| 1 | 0 | 1 | Invalid | N/A |
| 1 | 0 | 0 | 2 page buffer units | Two planes of any tile |
| 0 | 1 | 1 | 2 page buffer units | Any combination of one plane in each tile |
| 0 | 1 | 0 | 3 page buffer units | Any combination of tile addressed by P_ADD2 and one plane addressed by P_ADD1 |
| 0 | 0 | 1 | 3 page buffer units | Any combination of tile addressed by P_ADD1 and one plane addressed by P_ADD2 |
| 0 | 0 | 0 | 4 page buffer units | All planes |

As shown in Table 2, memory bank 500 can be configured to have any page size between one page buffer unit and four page buffer units. Moreover, for the two and three page buffer unit size configurations, any combination of planes can be simultaneously selected. This provides flexibility for the memory controller to execute wear leveling schemes for extending the endurance of each plane. It is noted that there are two combinations of CONF1, CONF2 and CONF3 which do not have to be used, and for the presently described example are labeled as invalid configuration settings. This is due to the fact that non-matching tile and plane addresses can be provided, resulting in none of the planes being selected eventhough plane and tile addresses have been provided. For example, T_ADD can select the tile containing planes 202 and 204, but only P_ADD2 is at the active logic level to select one of planes 206 and 208. Such addressing is considered invalid for the two invalid configuration settings.

The previously presented example embodiment of FIG. 13 includes configuration register 510 for receiving the bits of page size configuration data P_SIZE. For the alternate embodiment where on-the-fly dynamic page size configuration is used, configuration register 510 is omitted, and P_SIZE1, P_SIZE2 and P_SIZE3 are connected directly to lines CONF1, CONF2 and CONF3 respectively. Accordingly, as the operational command is decoded, P_SIZE1, P_SIZE2 and P_SIZE2 are fed directly to configuration decoder 508.

The previously presented example embodiments are directed to a memory bank having two tiles, where each tile includes a pair of planes coupled to a shared row decoder. Alternate example embodiments can include a memory bank having more than two tiles. Accordingly, the corresponding page size configurator will be appropriately scaled to receive a corresponding number of address signals such that a corresponding number of enable signals can be provided for controlling the shared row decoders. Furthermore, the previously presented example embodiments illustrate decoding architectures where tile enabling signals are decoded at the same time with plane enabling signals for generating the row decoder enabling signals. Persons skilled in the art will understand that the plane enabling signals can be encoded to include the logic state information of the tile enabling signal, thereby obviating the need for the plane selectors as further decoding logic would be included to combine the plane address information with the tile address information for providing the plane enabling signals. Hence the plane enabling signals become the row decoder enabling signals in such an alternate embodiment. In a further alternate embodiment, the planes are not organized as tiles. In such an alternate embodiment a tile address is not required, as each dedicated row decoder would directly receive a corresponding plane enabling signal for enabling it to drive wordlines of its respective plane.

In summary, the general operation of a memory device including the embodiments of memory bank 200 of FIG. 5, memory bank 400 of FIG. 6 and memory bank 500 of FIG. 12 is described with reference to the flow chart of FIG. 15. Any operation begins by loading the configuration register, such as configuration register 510 of FIG. 12, with page size configuration data P_SIZE. As previously mentioned, the configuration register can be loaded statically once after power up initialization of the memory device at step 600, or dynamically loaded with a command received by the memory device at step 602. Dynamic loading can include loading the configuration register in between normal commands with a dedicated command, or on-the-fly in a normal command. The normal command will have a modified op-code instructing controlling circuits within the flash memory device to route the page size configuration data directly to the configuration decoder of the memory bank. Alternately, a combination of the schemes can be used. For example, at power up initialization the memory controller can issue a default configuration setting for the memory device. Then commands can be later issued by the memory controller that include the page size configuration data. Once the configuration registers are loaded, the decoder circuits are logically configured at step 604 for a particular decoding scheme determined by the bit pattern of the page size configuration data. As shown in the previously described embodiments, both the plane decoders and tile decoders are logically configured by the page size configuration data. Once the decoders have been configured by the page size configuration data, they are ready to decode address information at step 606 from a command for selecting one or more planes of the memory bank during read, program or erase operations.

According to the presently described embodiments, the page size configuration data can be provided with a normal operating command or as a dedicated command or input signal to the memory device. For example, a normal operating command such as a read command can include the op-code corresponding to a read operation and column and row address data, where the row address data can include the page size data. A dedicated command or input signal can include a preset opcode and the page size data. The input/output (I/O) interface of the memory device will dictate the format of the command. For example, if the I/O interface is a serial interface, then the commands are received as one or more bitstreams. On the other hand, if the I/O interface is a parallel interface, then the bits of each command are received in parallel sets, where each set is as wide as the preset I/O width of the memory device.

Figure 15:
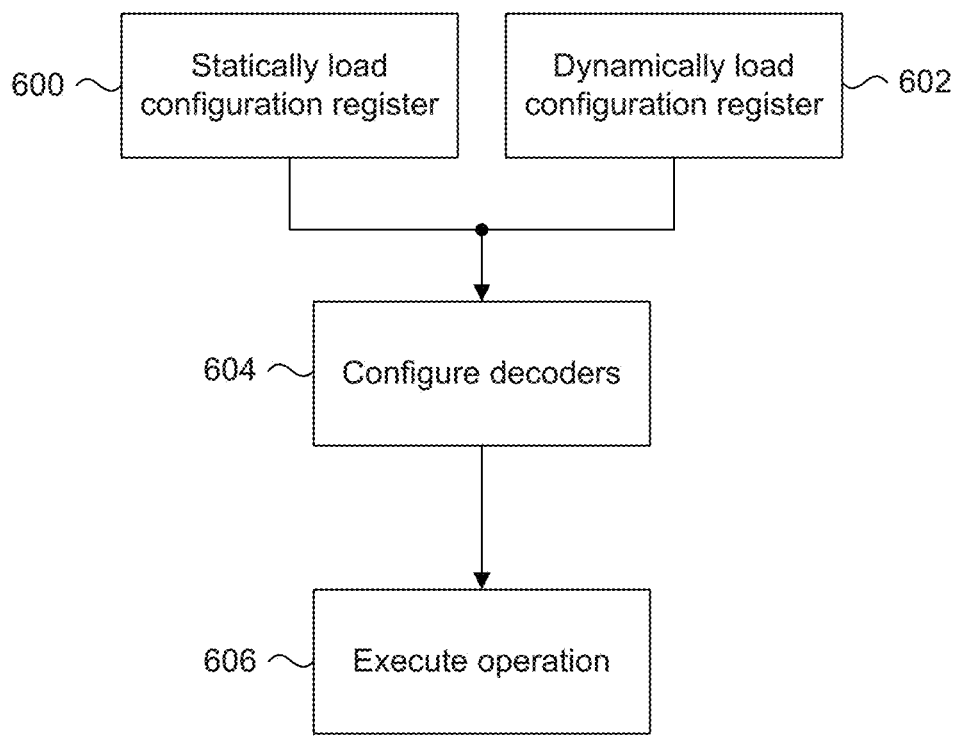
FIG. 15 is a flow chart of a method for operating a configurable page size memory bank, according to a present embodiment.

The previously shown flow chart of FIG. 15 illustrates the general operation of a memory device. A detailed description illustrating a method for controlling the memory device according to a presently described embodiment is provided below.

Figure 16:
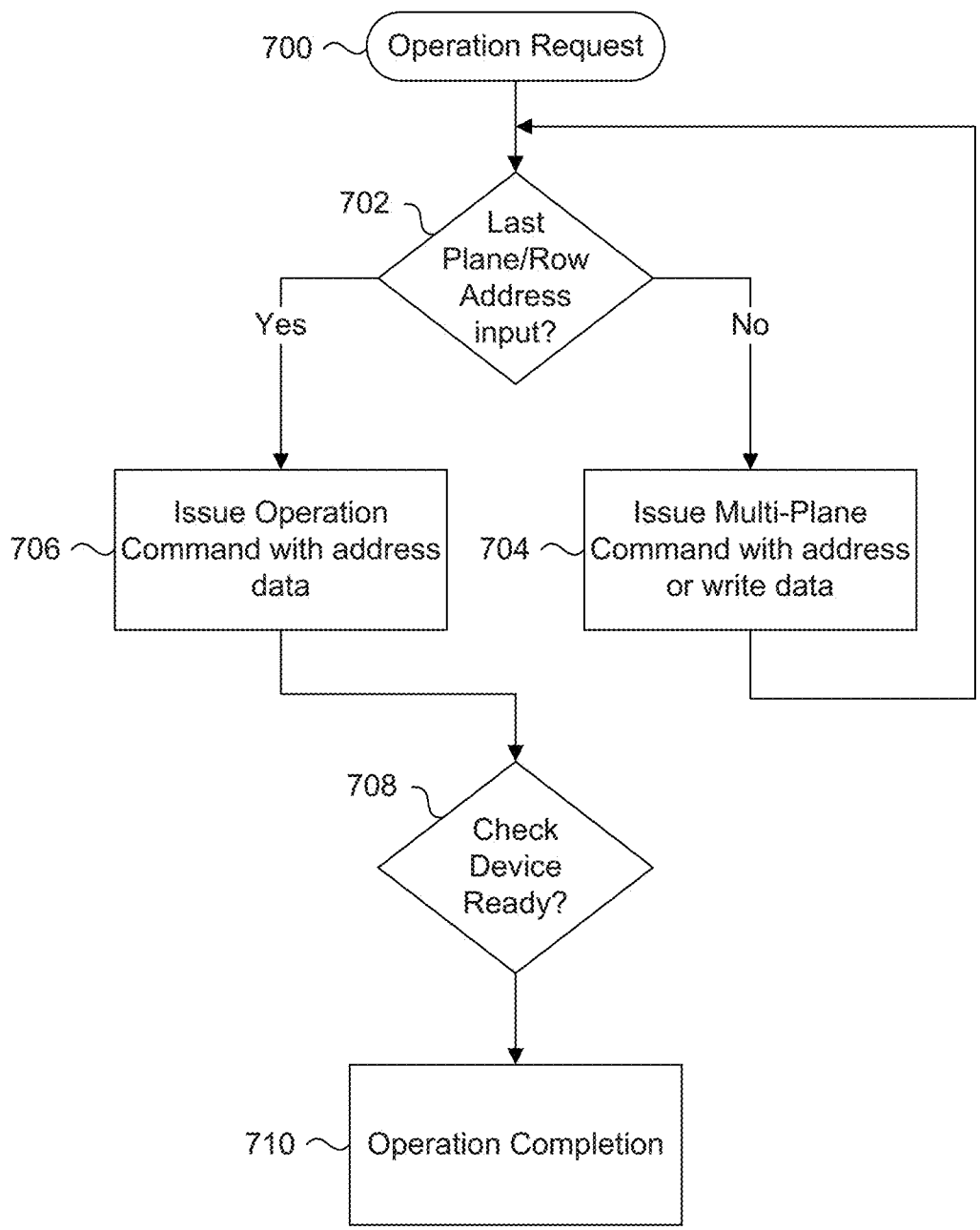
FIG. 16 is a flow chart of a method for controlling a configurable page size memory bank, according to a present embodiment.

The flow chart of FIG. 16 describes steps executed by a controlling device external to the memory device, such as a memory controller for example, for accessing one or more planes of the memory device. The method starts at step 700 where an operation request is received by the memory controller. Such requests can be received from a host system within which the memory controller is in communication with, and the operation request can include one of a read, program or erase operation request. At step 702, the memory controller determines if the last plane/row address is ready to be provided to the memory device. If not, the method proceeds to step 704 where a multi-plane command is issued to the memory device, along with address and/or write data. In one example, this row address is 3-bytes in size and includes address data for selecting a particular page, or row in a plane, and a plane address data for selecting a particular plane. The row address can be RA while the plane address can be P_ADD1 and PADD2 for example. The method iteratively loops between steps 702 and 704 until the last plane/row address has been provided to the memory device. With each iteration, the address information is latched within the circuits of the memory device. Once the last plane/row address is ready to be issued, the memory controller issues a command corresponding to the operation request at step 706, with the last address data. In response, the memory device executes the command using the latched addresses, including the last addresses provided in step 706. Once the memory device confirms to the memory controller that it is ready at step 708, then further completion steps are executed at step 710 to complete the operation.

The previous method steps have been described to generically include read, program and erase operations. Thus, there are specific steps executed in steps 704, 706 and 710 for each of the read, program and erase operations. For a program operation, step 704 includes issuing a column address and a row address with data to be programmed, and step 706 includes issuing a program command with the last column address, row address and write data. The completion steps 710 for the program operation include checking the program status of the memory device, which can result with an indication of either a programming error or successful completion of programming. For an erase operation, such as a block erase operation for example, step 704 includes issuing an address including the block address to be erased, and step 706 includes issuing the block erase command with the last block address to be erased. The completion steps 710 for the block erase operation include checking the erase status of the memory device, which can result with an indication of either an erase error or successful erasure. Those skilled in the art understand that one memory block is typically the smallest unit of memory that can be erased at one time. However, portions of a memory block can be erased as described in commonly owned U.S. Patent Publication No. 2008-0219053, filed on Jul. 18, 2007. Accordingly, the presented embodiments can be applied to the flash memory described in U.S. Patent Publication No. 2008-0219053.

The completion steps for a read operation require more steps than for the program and erase operations. A full description of a multiple plane read operation according to the presently presented embodiment is described with reference to the previously shown flow chart of FIG. 16, the read operation completion flow chart of FIG. 17, and the corresponding illustrated read sequence of FIG. 18. In this example, two planes in two different tiles are to be selected for reading data therefrom. Starting in FIG. 16, the memory controller checks at step 702 if the last plane/row address is ready to be issued. Since the first addresses are to be issued, the method proceeds to step 704 where the first multi-plane address input command is issued with the row and plane addresses. In FIG. 18, an example multi-plane address input command byte in hexadecimal format is shown as 01 h, followed by a 3-cycle row address input sequence, which includes the plane address. In the presently described example, a page or row in plane 2 is selected. At this point, the row address and plane addresses are latched in the decoding circuits corresponding to plane 2. Returning to step 702 of FIG. 16, the second and last plane/row address is ready to be provided, and the method proceeds to step 706 where a read command with a 5-cycle column and row address input sequence is provided. In FIG. 18, an example multi-plane address input command byte in hexadecimal format is shown as 00h, followed by a 5-cycle column and row address input sequence. A read confirm command 30h is provided after the addresses are issued. In the presently described example, a page or row in plane 4 is selected.

Because a page read command was issued, the control circuits of the memory device begin internal operations to read the data from the selected pages in planes 2 and 4. more specifically, the internal read operation starts once the address latch cycles for the last addresses are finished. The data of the selected pages are simultaneously sensed and transferred to the page buffer in less than tR, where tR is the transfer time from the cell array to the page buffer. It is noted that tR is same regardless of the number of planes that have been selected.

In FIG. 16, the memory device will eventually provide an indication, such as a ready/busy signal, informing the memory controller at step 708 that the tR period is finished and data is ready to be read out from the page buffers. Now the operation completion steps of 710 for the multi-plane read operation will follow in the flow chart of FIG. 17.

Figure 17:
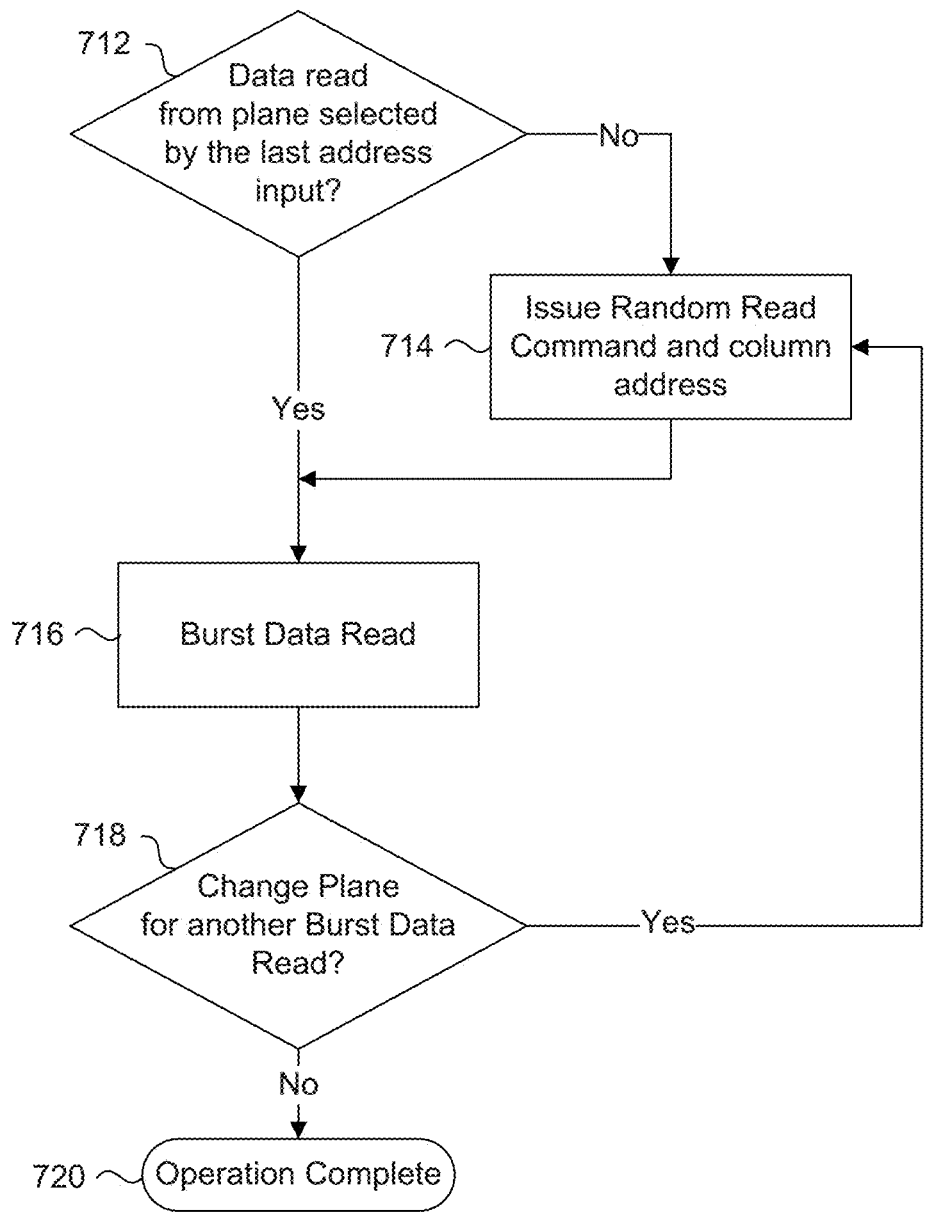
FIG. 17 is a flow chart of a method for completing a multi-plane read operation, according to a present embodiment.
Figure 18:
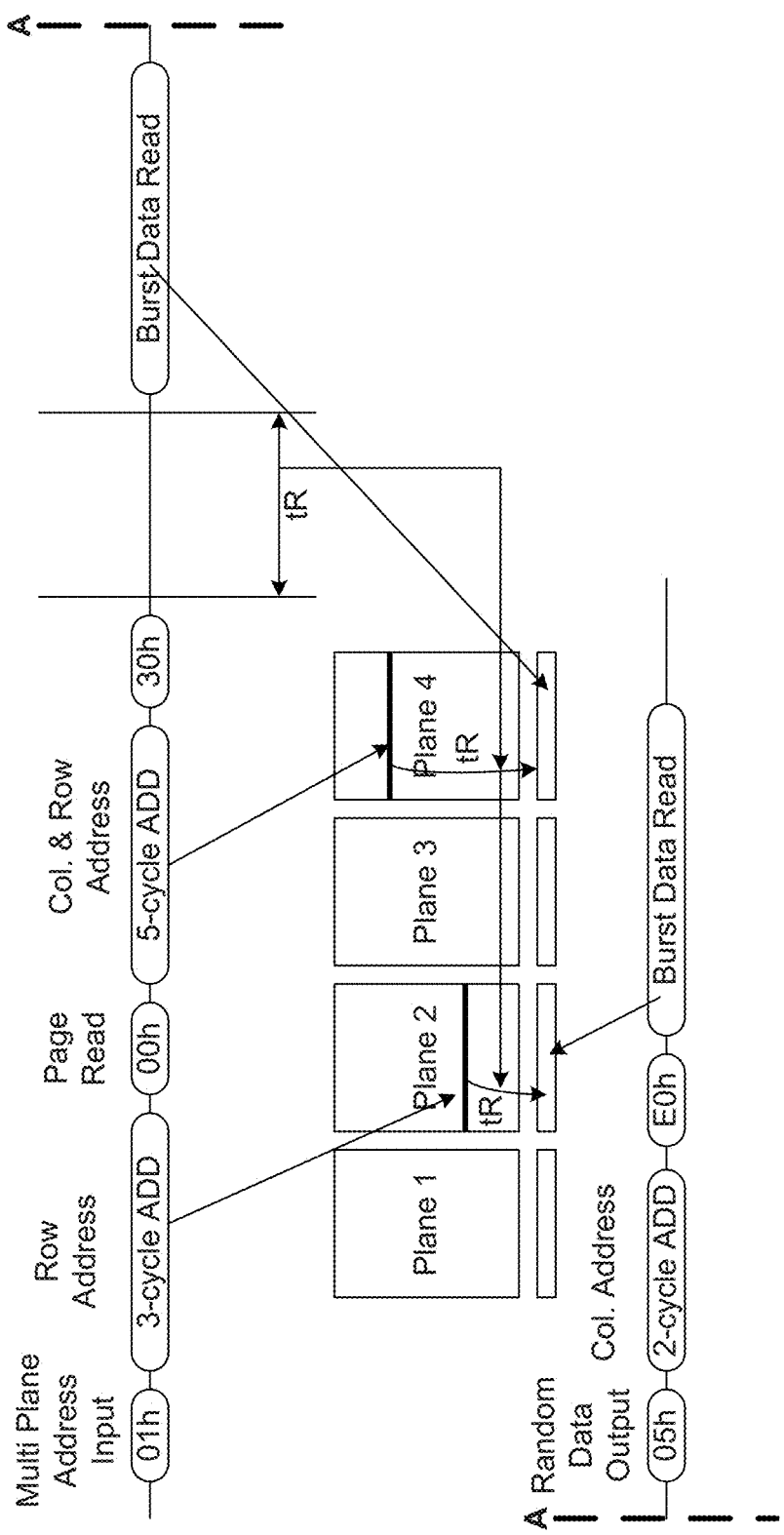
FIG. 18 is an operation sequence for executing a multi-plane read operation, according to a present embodiment.

The first completion step 712 of FIG. 17 is to determine if the data to be read out will be from the last plane address provided to the memory device, which corresponds to plane 4 in the presently described example. Alternately, step 712 can determine if the data to be read out will be from the first plane address provided to the memory device. These two different schemes are design choices for the memory device and either can be used. Since this condition is met, a burst data read command is issued at step 716 and the data stored in the page buffer corresponding to plane 4 is read out of the memory device. Otherwise, if data is to be read from a previously addressed plane, the method proceeds to step 714 where a random read command is issued with a column address, where the column address corresponds to a specific bit position in the page buffer where data is to be read out from. In the presently described example, the random read command is used for enabling the decoding circuits of the memory device to receive the new column address for reading out data from the corresponding page buffer. Following at step 718, the memory controller determines if there is another plane to read data from. Because there is data in plane 2 to read from, the method returns to step 714 where a random read command is issued with a new column address to the memory device. The random read command is shown as 05h in FIG. 18 followed by a 2-cycle column address input sequence, and ending with a confirm command E0h. Then a burst data read occurs in step 716 to read out data from plane 2. At step 718, there are no further planes to read data from, and the read operation ends at step 720.

Figure 19:
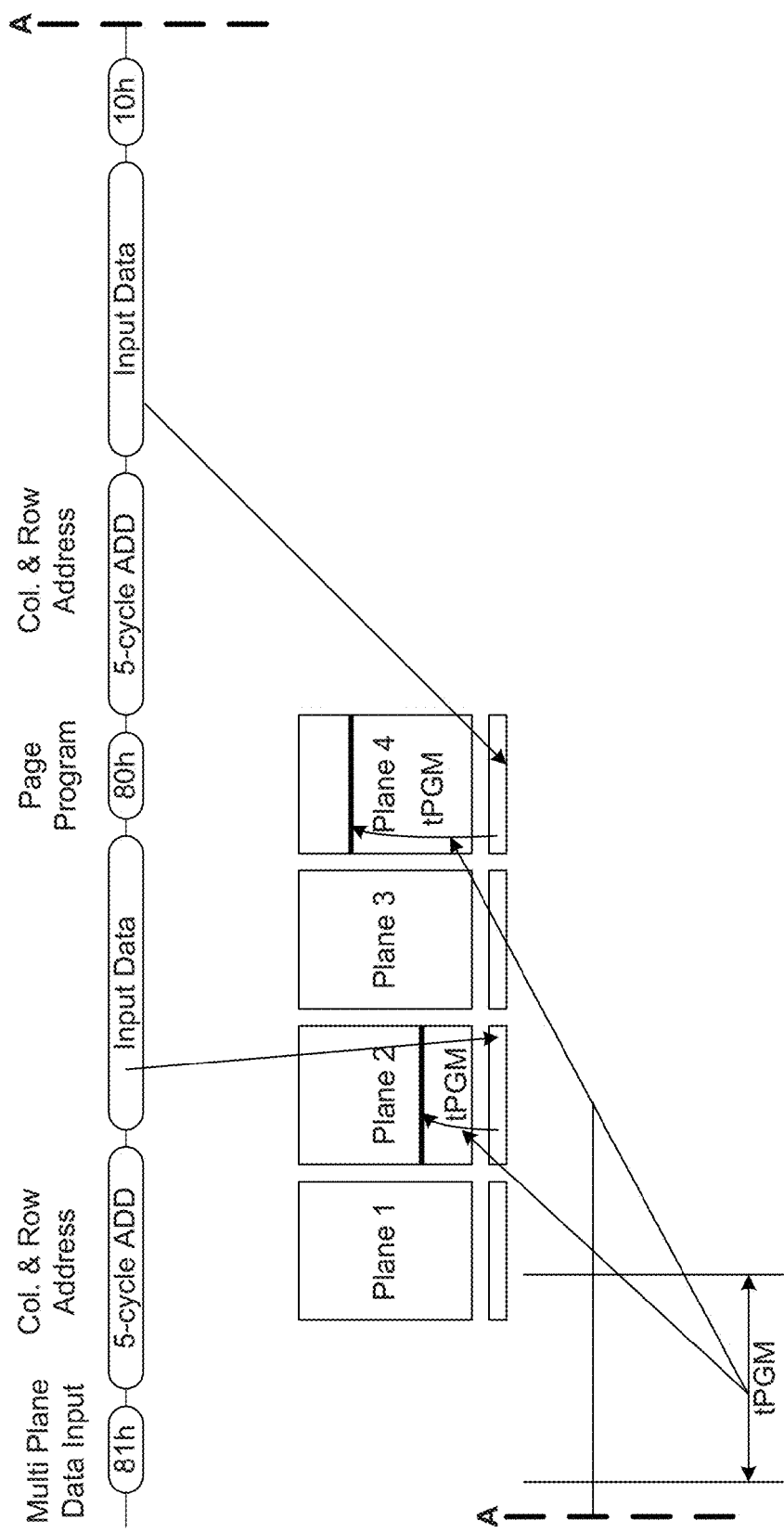
FIG. 19 is an operation sequence for executing a multi-plane program operation, according to a present embodiment.
Figure 20:
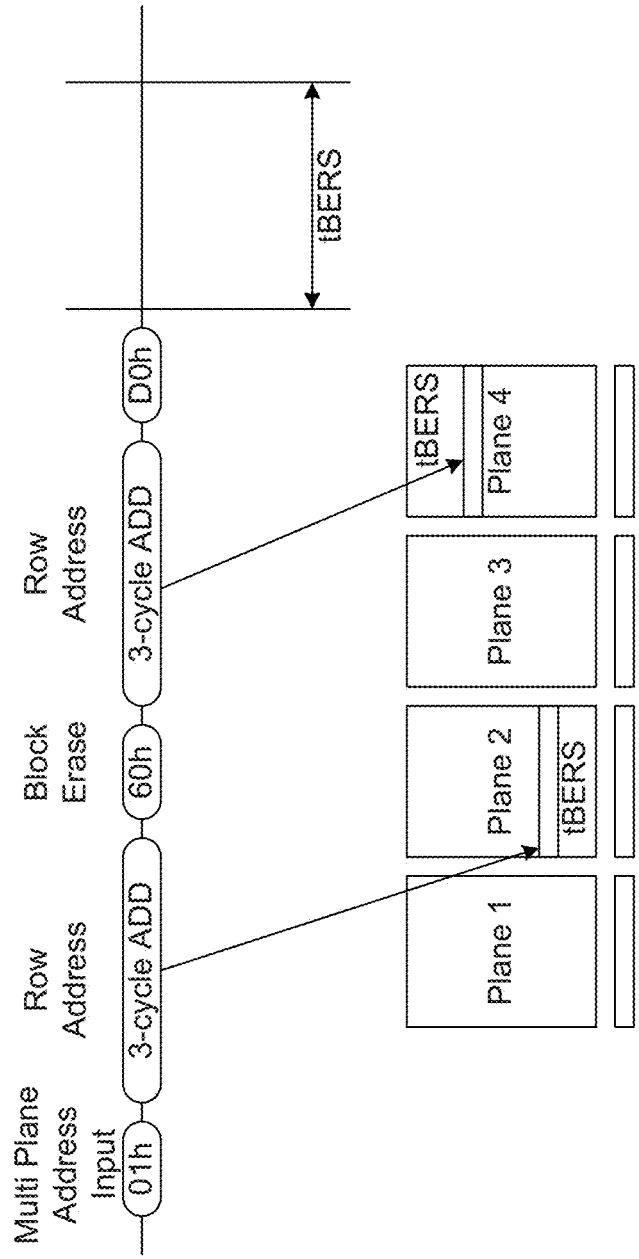
FIG. 20 is an operation sequence for executing a multi-plane erase operation, according to a present embodiment.

Brief example descriptions for multi-plane program and erase operations, according to the presently described embodiments with reference to the illustrated sequences of FIG. 19 and FIG. 20 will now be provided. FIG. 19 is an illustrated sequence for programming 2 planes of a memory bank having 4 planes. The programming sequence begins with a multi-plane write data input command 81h, followed by a 5 cycle column and row address input sequence, which itself is followed by the program data. In the presently described example, the program data is loaded into the page buffer corresponding to plane 2, and a particular row in plane 2 is selected as the target location for programming the data in the page buffer. The address for the second and last page to be programmed is provided by issuing a page program command 80h followed by a 5 cycle column and row address input sequence, which itself is followed by further program data. In the presently described example, a row address different than for plane 2 is selected for plane 4. A page program confirm command 10h follows after the further program data. Once the address latching has finished, internal operations for programming the data in the page buffers begins. The data loaded into the page buffers of planes 2 and 4 are simultaneously programmed in less than tPROG, which is the elapsed page program time. It is noted that the page program time tPROG is same regardless of the number of planes selected in the memory bank.

FIG. 20 is an illustrated sequence for erasing blocks from 2 planes of a memory bank having 4 planes. The erase sequence begins with a multi-plane address input command 01h, followed by a 3 cycle row address input sequence. In the presently described example, the row address selects a specific block in plane 2. The block address for the second and last block to be erased is provided by issuing a block erase command 60h followed by a 3 row address input sequence. In the presently described example, a block address different than for plane 2 is selected for plane 4. A block erase confirm command D0h follows after the row addresses are provided. Once the address latching has finished, internal operations for erasing the data in the selected blocks of planes 2 and 4 begins. The data of the selected blocks are simultaneously erased in less than tBERS, where tBERS is the block erase time. It is noted that the block erase time tBERS is same regardless of the number of planes selected in the memory bank.

Figure 21:
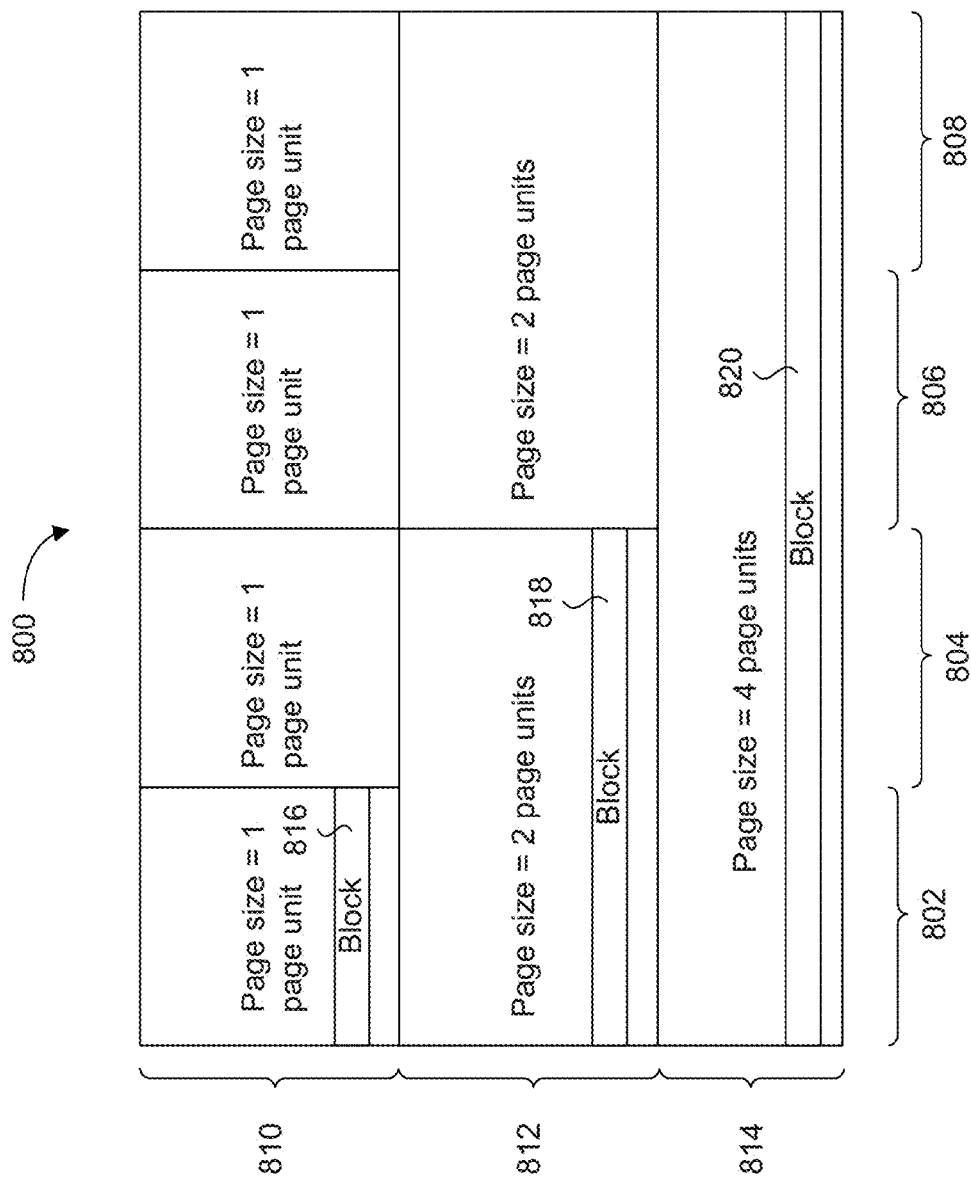
FIG. 21 is an example logical partition of a memory bank, according to a present embodiment; and, FIG. 22 is another example logical partition of a memory bank, according to a present embodiment.
Figure 22:
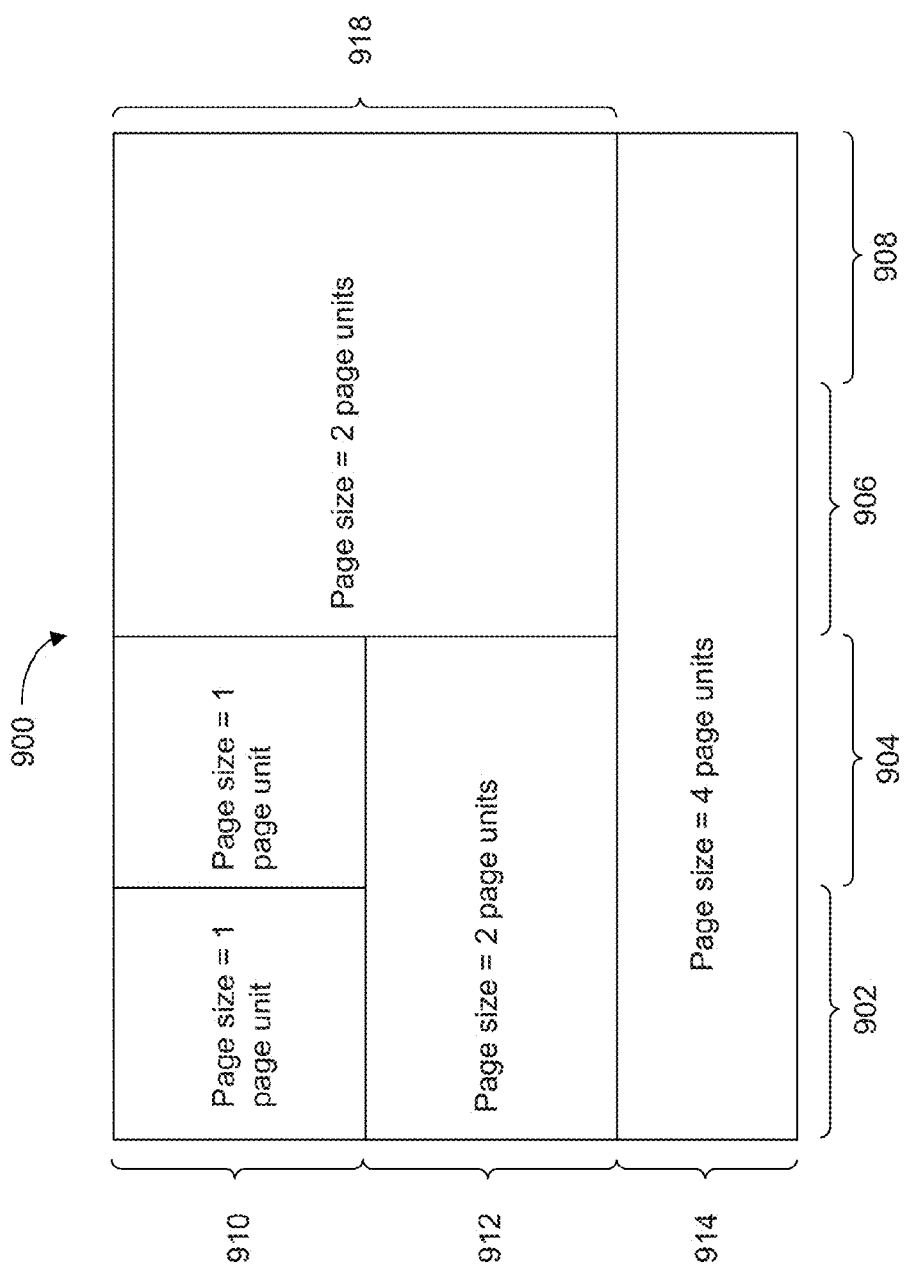

Accordingly, the circuit and methods for multi-bank access provides full flexibility to host systems by allowing them to selectively configure the page size for each memory bank of a memory device. The configuration can be done statically upon power up of the memory device, or dynamically through commands received by the memory device. An advantage of a dynamic configuration is that the memory bank can be logically partitioned to have different page sizes based on the row address provided to the memory bank. FIG. 21 and FIG. 22 are example logical partitions of a memory bank having 4 planes, according to a presently described embodiment.

In FIG. 21, memory bank 800 includes four planes, 802, 804, 806 and 808 located in two tiles, as in the example embodiments shown in FIGS. 5, 9 and 12. The four planes of the presently described embodiment are arranged in a symmetric partitioning scheme. In the symmetric partitioning scheme, every plane has the same logical configuration. More specifically, each plane has the same number and physical positioning of rows that represent either the smallest page size or a portion of predetermined page sizes for the memory bank. As shown in FIG. 21, each of the planes have logical row groupings 810, 812 and 814. This is but one example logical row configuration of many possible combinations. Each row grouping includes a sequential number of rows, or pages. In the example mapping shown in FIG. 21, row grouping 810 is set such that each plane provides a minimum page size of one page unit for memory bank 800, row grouping 812 is set such that each plane provides one half of a 2 page unit page, and row grouping 814 is set such that each plane provides one quarter of a 4 page unit page. Once this logical mapping scheme is known to the memory controller, application specific data can be selectively programmed to the most appropriate row grouping. For example, large multimedia files are programmed to row grouping 814 since its page size is the largest for memory bank 800, small data files are programmed to row grouping 810, and intermediate sized data files are programmed to row grouping 812.

FIG. 21 further illustrates another characteristic of the 1, 2 and 4 page unit page sizes. The 1 page unit page sizes have memory blocks 816, of which only one is shown, where the memory block size is determined by the number of wordlines per NAND cell string and the NAND cell strings of one plane. The 2 page unit page sizes have memory blocks 818, of which only one is shown, and have the same number of wordlines per NAND cell string. Accordingly, memory block 818 is twice the size of memory block 816 since it includes the NAND cell strings of two planes. The 4 page unit page size has memory block 820 having the same number of wordlines per NAND cell string. Accordingly, memory block 820 is twice the size of memory block 818 and four times the size of memory block 816 since it includes the NAND cell strings of all four planes.

In FIG. 22, memory bank 900 includes four planes, 902, 904, 906 and 908 located in two tiles, as in the example embodiments shown in FIGS. 5, 9 and 12. The four planes of the presently described embodiment are arranged in an asymmetric partitioning scheme. In the asymmetric partitioning scheme, the logical row groupings can vary from plane to plane. In FIG. 22 for example, planes 902 and 904 have logical row groupings 910 and 914, while planes 902, 904, 906 and 908 have logical row grouping 914. However, planes 906 and 908 have row grouping 918. Therefore, only planes 902 and 904 can provide single page unit pages, while planes 906 and 908 do not provide any single page unit pages. Instead, planes 906 and 908 are configured to provide a larger number of 2 page unit pages than planes 902 and 904.

While not shown in the example partitioning schemes of FIGS. 21 and 22, a row grouping having 3 page unit page sizes can be set to span three planes. For the 2 and 3 page unit page sizes, different combinations of planes can be combined together where non-adjacent planes form the page. Therefore, the configurable page size for a memory bank allows for efficient use of the available memory capacity for different applications.

Therefore, the previously described embodiments allow for application specific storage of data in a memory bank of a memory device. To maximize storage efficiency and thus minimize the number of memory cells exposed to unnecessary program and erase cycles, data can be stored in rows of the memory bank designated to have the smallest page size greater than the size of the data. Furthermore, performance is enhanced because internal read, program and erase times remain substantially constant when as the page size is increased. Circuit embodiments for a memory device have been presented to illustrate examples of how logic decoding operations can be dynamically or statically set using configuration data. Access operations by a memory controller for controlling the memory device having such circuits have been presented to illustrate example sequences for accessing the individual planes that make up a configured page size.

In the preceding description, for purposes of explanation, numerous details are set forth in order to provide a thorough understanding of the embodiments of the invention. However, it will be apparent to one skilled in the art that embodiments of the invention will take different forms independent of various specific details that have been described. Also, in some instances well-known electrical structures and circuits are shown in block diagram form in order not to obscure the invention.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method comprising:
issuing a first command to a flash memory device having a plurality of planes, the first command including a first plane address specifying a first plane and a first row address specifying a first row in the first plane;
issuing a second command to the flash memory device, the second command including a second plane address specifying a second plane and a second row address specifying a second row in the second plane, to instruct the flash memory device to simultaneously sense and transfer data stored in the first row and the second row to a first page buffer of the first plane and a second page buffer of the second plane respectively;
issuing a third command to the flash memory device to instruct the flash memory device to output data from a first one of the first and second page buffers;
receiving the data from the first one of the first and second page buffers;
issuing a fourth command to the flash memory device to instruct the flash memory device to output data from a second different one of the first and second page buffers; and
receiving the data from the second different one of the first and second page buffers.

2. The method as claimed in claim 1 wherein the first command is an address input command.

3. The method as claimed in claim 1 wherein the second command is a page read command.

4. The method as claimed in claim 1 wherein the second command includes a first column address.

5. The method as claimed in claim 4 wherein the third command is a burst data read command and the flash memory device outputs data from the first one of the first and second page buffers starting at the first column address in response to the third command.

6. The method as claimed in claim 5 wherein the first one of the first and second page buffers is the second page buffer.

7. The method as claimed in claim 1 wherein the fourth command includes a first column address.

8. The method as claimed in claim 7 wherein the fourth command is a random data output command and the flash memory device outputs data from the second different one of the first and second page buffers starting at the first column address in response to the fourth command.

9. The method as claimed in claim 1 further comprising:
before the issuing of the second command, issuing a fifth command to the flash memory device including a third plane address specifying a third plane and a third row address specifying a third row in the third plane,
wherein the flash memory device simultaneously senses and transfers data stored in the first row, the second row, and the third row to a first page buffer of the first plane, a second page buffer of the second plane, and a third page buffer of the third plane respectively, following the issuance of the second command.

10. A method for programming data in a flash memory device, comprising:
issuing a first command to a flash memory device having a plurality of planes, the first command including a first plane address specifying a first plane and a first row address specifying a first row in the first plane;
providing first input data to the flash memory device;
issuing a second command to the flash memory device, the second command including a second plane address specifying a second plane and a second row address specifying a second row in the second plane;
providing second input data to the flash memory device; and
issuing a third command to the flash memory device to instruct the flash memory device to simultaneously program the first input data in the first row and the second input data in the second row.

11. The method as claimed in claim 10 wherein the first command is a data input command.

12. The method as claimed in claim 10 wherein the first command includes a column address specifying a starting column address for the first input data.

13. The method as claimed in claim 10 wherein the second command is a page program command.

14. The method as claimed in claim 10 wherein the second command includes a column address specifying a starting column address for the second input data.

15. The method as claimed in claim 10 wherein the third command is a page program confirm command.

16. The method as claimed in claim 10 further comprising:
before the issuing of the third command, issuing a fourth command to the flash memory device, the fourth command including a third plane address specifying a third plane and a third row address specifying a third row in the third plane; and
providing third input data to the flash memory device,
wherein the flash memory device simultaneously programs the first input data in the first row, the second input data in the second row, and the third input data in the third row, following the issuance of the third command.

17. A method comprising:
issuing a first command to a flash memory device having a plurality of planes, the first command including a first plane address specifying a first plane and a first block address specifying a first block in the first plane;
issuing a second command to the flash memory device, the second command including a second plane address specifying a second plane and a second block address specifying a second block in the second plane; and
issuing a third command to the flash memory device to instruct the flash memory device to simultaneously erase the first block and the second block.

18. The method as claimed in claim 17 wherein the first command is an address input command.

19. The method as claimed in claim 17 wherein the second command is a block erase command.

20. The method as claimed in claim 17 wherein the third command is a block erase confirm command.

21. The method as claimed in claim 17 further comprising:
before the issuing of the third command, issuing a fourth command to the flash memory device, the fourth command including a third plane address specifying a third plane and a third block address specifying a third block in the third plane,
wherein the flash memory device simultaneously erases the first block, the second block, and the third block following the issuance of the third command.

* * * * *